(12) United States Patent
Wang et al.

(10) Patent No.: US 12,300,729 B2
(45) Date of Patent: May 13, 2025

(54) LOW RESISTANT CONTACT METHOD AND STRUCTURE

(71) Applicant: Taiwan Semiconductor Manufacturing Company, Ltd., Hsinchu (TW)

(72) Inventors: Yu-Sheng Wang, Tainan (TW); Yu-Ting Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/715,927

(22) Filed: Dec. 16, 2019

(65) Prior Publication Data

US 2020/0119152 A1   Apr. 16, 2020

Related U.S. Application Data

(62) Division of application No. 15/583,570, filed on May 1, 2017, now Pat. No. 10,510,851.

(Continued)

(51) Int. Cl.
*H01L 29/417*    (2006.01)
*H01L 21/02*    (2006.01)
(Continued)

(52) U.S. Cl.
CPC .. *H01L 29/41791* (2013.01); *H01L 21/02063* (2013.01); *H01L 21/261* (2013.01);
(Continued)

(58) Field of Classification Search
CPC ....... H01L 21/823431; H01L 21/76846; H01L 21/823821; H01L 21/76804;
(Continued)

(56) References Cited

U.S. PATENT DOCUMENTS 5,024,954 A * 6/1991 Chen ................ H01L 21/26513
438/581
5,126,810 A * 6/1992 Gotou ................ H10B 12/318
257/306

(Continued)

OTHER PUBLICATIONS

Loh et al., Effective Modulation of Ni Silicide Schottky Barrier Height Using Chlorine Ion Implantation and Segregation (Year: 2009).*

(Continued)

*Primary Examiner* — Sophia T Nguyen
(74) *Attorney, Agent, or Firm* — Slater Matsil, LLP

(57) ABSTRACT

A device includes a metal-silicide region formed in a semiconductor material in a contact opening. A concentration of a material, including chlorine, fluorine, or a combination thereof is in the metal-silicide region near an uppermost surface of the metal-silicide region. The presence of chlorine or fluorine results from a physical bombarding of the chlorine or fluorine in the contact opening. As a result of the physical bombard, the opening becomes wider at the bottom of the opening and the sidewalls of the opening are thinned. A capping layer is over the metal-silicide region and over sidewalls of a contact plug opening. A contact plug is formed over the capping layer, filling the contact plug opening. Before the contact plug is formed, a silicidation occurs to form the metal-silicide and the metal-silicide is wider than the bottom of the opening.

20 Claims, 11 Drawing Sheets

Related U.S. Application Data

(60) Provisional application No. 62/427,716, filed on Nov. 29, 2016.

(51) Int. Cl.

| | | |
|---|---|---|
| *H01L 21/261* | (2006.01) | |
| *H01L 21/263* | (2006.01) | |
| *H01L 21/285* | (2006.01) | |
| *H01L 21/322* | (2006.01) | |
| *H01L 21/768* | (2006.01) | |
| *H01L 21/8234* | (2006.01) | |
| *H01L 27/088* | (2006.01) | |
| *H01L 29/45* | (2006.01) | |
| *H01L 29/66* | (2006.01) | |
| *H01L 29/78* | (2006.01) | |
| *H01L 21/265* | (2006.01) | |

(52) U.S. Cl.
CPC .... *H01L 21/2633* (2013.01); *H01L 21/28518* (2013.01); *H01L 21/3221* (2013.01); *H01L 21/76814* (2013.01); *H01L 21/76843* (2013.01); *H01L 21/76855* (2013.01); *H01L 21/76889* (2013.01); *H01L 21/76897* (2013.01); *H01L 21/823431* (2013.01); *H01L 21/823468* (2013.01); *H01L 21/823475* (2013.01); *H01L 27/088* (2013.01); *H01L 29/456* (2013.01); *H01L 29/6656* (2013.01); *H01L 29/66795* (2013.01); *H01L 21/26506* (2013.01); *H01L 21/76804* (2013.01); *H01L 21/823425* (2013.01); *H01L 29/665* (2013.01); *H01L 29/6653* (2013.01); *H01L 29/66545* (2013.01); *H01L 29/7845* (2013.01); *H01L 29/7855* (2013.01)

(58) Field of Classification Search
CPC ..... H01L 21/823468; H01L 21/823864; H01L 21/823475; H01L 21/7684; H01L 21/823425; H01L 21/823871; H01L 29/7851; H01L 29/7855; H01L 29/6653; H01L 29/66553; H01L 29/6656; H01L 29/41791; H01L 29/456; H01L 29/7845; H01L 29/0874; H01L 23/535; H01L 21/823418; H01L 21/32051–32053; H01L 21/76889; H01L 21/28052; H01L 21/28518; H01L 21/76897; H01L 21/823814; H01L 29/665; H01L 29/66795
See application file for complete search history.

(56) References Cited

U.S. PATENT DOCUMENTS

| | | | | |
|---|---|---|---|---|
| 5,500,544 A * | 3/1996 | Park | H10B 12/033 | 257/305 |
| 5,527,718 A * | 6/1996 | Seita | H01L 21/28176 | 257/E21.2 |
| 5,545,592 A * | 8/1996 | Iacoponi | H01L 21/28518 | 438/655 |
| 5,565,708 A * | 10/1996 | Ohsaki | H01L 21/76846 | 257/770 |
| 5,624,867 A * | 4/1997 | Cheng | H01L 21/2257 | 257/E21.151 |
| 5,710,454 A * | 1/1998 | Wu | H01L 29/4925 | 257/388 |
| 5,801,097 A * | 9/1998 | Chang | H01L 21/76856 | 438/653 |
| 5,885,896 A | 3/1999 | Thakur et al. | | |
| 5,899,741 A * | 5/1999 | Tseng | H01L 21/76862 | 438/649 |
| 5,940,699 A * | 8/1999 | Sumi | H01L 21/2652 | 257/E21.336 |
| 5,994,210 A * | 11/1999 | Kerr | H01L 21/3215 | 257/E21.315 |
| 6,008,124 A * | 12/1999 | Sekiguchi | H01L 21/76856 | 438/653 |
| 6,027,990 A * | 2/2000 | Thakur | H01L 21/28518 | 438/533 |
| 6,054,768 A * | 4/2000 | Givens | H01L 23/53223 | 438/424 |
| 6,133,122 A * | 10/2000 | Yamamoto | H01L 29/665 | 438/533 |
| 6,140,705 A * | 10/2000 | Liu | H01L 21/76897 | 257/E21.582 |
| 6,165,880 A * | 12/2000 | Yaung | H01L 21/76897 | 257/E21.507 |
| 6,221,792 B1 * | 4/2001 | Yang | H01L 21/76843 | 438/651 |
| 6,242,348 B1 * | 6/2001 | Kamal | H01L 21/26506 | 257/E21.199 |
| 6,335,279 B2 * | 1/2002 | Jung | H01L 21/76897 | 257/E21.507 |
| 6,348,379 B1 | 2/2002 | Wang et al. | | |
| 6,362,094 B1 * | 3/2002 | Dabbaugh | H01L 21/76832 | 257/E21.507 |
| 6,413,811 B1 * | 7/2002 | Masuoka | H01L 21/823425 | 257/E21.62 |
| 6,437,411 B1 * | 8/2002 | Choi | H01L 21/32134 | 257/413 |
| 6,472,700 B2 * | 10/2002 | Wakao | H01L 21/823425 | 257/E21.507 |
| 6,475,847 B1 | 11/2002 | Ngo et al. | | |
| 6,486,015 B1 * | 11/2002 | Chaudhary | H01L 21/02271 | 257/E21.267 |
| 6,528,418 B1 * | 3/2003 | Kim | H01L 21/76897 | 257/E21.507 |
| 6,544,908 B1 * | 4/2003 | Weimer | H01L 21/3003 | 438/798 |
| 6,562,699 B1 * | 5/2003 | Kataoka | H01L 29/6659 | 257/E21.507 |
| 6,607,955 B2 * | 8/2003 | Lee | H01L 21/32139 | 257/E21.314 |
| 6,661,048 B2 * | 12/2003 | Yamanaka | H01L 21/32053 | 257/E21.59 |
| 6,670,682 B1 | 12/2003 | Mouli | | |
| 6,686,288 B1 * | 2/2004 | Prall | H01L 21/76897 | 257/E21.507 |
| 6,731,008 B1 * | 5/2004 | Tomita | H01L 21/76897 | 257/772 |
| 6,756,291 B1 * | 6/2004 | Hao | H01L 21/28061 | 257/E21.194 |
| 6,790,723 B2 * | 9/2004 | Tanaka | H01L 21/3185 | 438/243 |
| 6,790,765 B1 | 9/2004 | Huang et al. | | |
| 6,797,611 B1 | 9/2004 | Wu et al. | | |
| 6,838,363 B2 * | 1/2005 | Wieczorek | H01L 29/6653 | 438/653 |
| 7,141,467 B2 * | 11/2006 | Hokazono | H01L 21/28202 | 438/199 |
| 7,160,800 B2 * | 1/2007 | Wu | H01L 21/3003 | 257/757 |
| 7,169,704 B2 * | 1/2007 | Koo | H01L 21/76843 | 438/677 |
| 7,208,409 B2 * | 4/2007 | Lu | H01L 21/28518 | 438/721 |
| 7,422,967 B2 * | 9/2008 | DeLoach | H01L 21/28518 | 438/513 |
| 7,534,709 B2 * | 5/2009 | Park | H01L 21/76843 | 257/E21.636 |
| 7,701,017 B2 * | 4/2010 | Tsuchiaki | H01L 21/823814 | 257/384 |
| 7,732,317 B2 * | 6/2010 | Shin | H01L 21/76831 | 438/597 |
| 7,776,675 B1 * | 8/2010 | Gan | H01L 21/28044 | 257/E21.334 |

(56) References Cited

U.S. PATENT DOCUMENTS

| | | | |
|---|---|---|---|
| 7,781,282 B2* | 8/2010 | Yoo | H01L 29/665 |
| | | | 438/230 |
| 7,919,813 B2* | 4/2011 | Tsuchiaki | H01L 21/28518 |
| | | | 257/349 |
| 7,968,954 B2* | 6/2011 | Wang | H01L 29/518 |
| | | | 257/E21.409 |
| 7,994,049 B2* | 8/2011 | Futase | H01L 21/28518 |
| | | | 438/296 |
| 8,058,695 B2* | 11/2011 | Matsuda | H01L 29/665 |
| | | | 438/682 |
| 8,470,707 B2* | 6/2013 | Xiong | H01L 29/665 |
| | | | 257/E21.619 |
| 8,524,592 B1* | 9/2013 | Xie | H01L 29/78 |
| | | | 257/387 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2* | 9/2014 | Wang | H01L 29/41758 |
| | | | 257/745 |
| 8,836,129 B1* | 9/2014 | Hung | H01L 23/5384 |
| | | | 257/760 |
| 8,860,148 B2 | 10/2014 | Hu et al. | |
| 8,927,407 B2 | 1/2015 | Baars et al. | |
| 8,975,708 B2* | 3/2015 | Toh | H01L 21/26506 |
| | | | 257/770 |
| 9,105,490 B2* | 8/2015 | Wang | H01L 29/7851 |
| 9,231,098 B2 | 1/2016 | Wang et al. | |
| 9,236,267 B2 | 1/2016 | De et al. | |
| 9,236,300 B2* | 1/2016 | Liaw | H10B 10/125 |
| 9,287,138 B2 | 3/2016 | Wang et al. | |
| 9,379,207 B2* | 6/2016 | Breil | H01L 21/321 |
| 9,520,482 B1 | 12/2016 | Chang et al. | |
| 9,548,366 B1* | 1/2017 | Ho | H01L 29/665 |
| 9,564,363 B1 | 2/2017 | Wang et al. | |
| 9,576,814 B2 | 2/2017 | Wu et al. | |
| 9,589,851 B2 | 3/2017 | Bu et al. | |
| 9,673,303 B2* | 6/2017 | Kim | H01L 21/31116 |
| 9,721,896 B2* | 8/2017 | Lin | H01L 23/535 |
| 9,741,812 B1* | 8/2017 | Adusumilli | H01L 21/76858 |
| 9,818,834 B2* | 11/2017 | Liu | H01L 21/31144 |
| 9,917,060 B1* | 3/2018 | Gluschenkov | H01L 29/66545 |
| 9,985,020 B2* | 5/2018 | Hung | H01L 29/41725 |
| 10,038,065 B2* | 7/2018 | Xie | H01L 21/76897 |
| 10,049,943 B2* | 8/2018 | Yeo | H01L 21/26513 |
| 10,079,210 B2* | 9/2018 | Lee | H01L 23/53209 |
| 10,332,978 B2* | 6/2019 | Lu | H01L 29/41791 |
| 10,998,228 B2* | 5/2021 | Yen | H01L 21/76832 |
| 2001/0005637 A1* | 6/2001 | Kim | H01L 21/76802 |
| | | | 438/710 |
| 2001/0025970 A1* | 10/2001 | Nozaki | H01L 27/14689 |
| | | | 257/E27.132 |
| 2002/0016044 A1* | 2/2002 | Dreybrodt | H01L 21/28061 |
| | | | 257/E21.101 |
| 2002/0022368 A1* | 2/2002 | Lee | H01L 21/76856 |
| | | | 438/683 |
| 2002/0024093 A1* | 2/2002 | Ahn | H10B 12/0335 |
| | | | 438/270 |
| 2002/0039838 A1* | 4/2002 | Iida | H01L 27/14687 |
| | | | 438/689 |
| 2002/0045353 A1* | 4/2002 | Kang | H01L 21/31116 |
| | | | 257/E21.507 |
| 2002/0045355 A1 | 4/2002 | Chong et al. | |
| 2002/0045360 A1* | 4/2002 | Murakami | H01L 21/823462 |
| | | | 257/E21.654 |
| 2002/0068395 A1* | 6/2002 | Tran | H10B 12/09 |
| | | | 257/E27.097 |
| 2002/0098689 A1* | 7/2002 | Chong | H01L 21/2658 |
| | | | 257/E21.337 |
| 2002/0111005 A1* | 8/2002 | Hsu | H01L 21/76895 |
| | | | 257/E21.59 |
| 2002/0132403 A1 | 9/2002 | Hung et al. | |
| 2002/0140100 A1 | 10/2002 | Yokoyama | |
| 2002/0175381 A1* | 11/2002 | Choi | H01L 21/32137 |
| | | | 257/E21.309 |
| 2002/0192868 A1* | 12/2002 | Kim | H01L 21/823468 |
| | | | 257/E21.507 |
| 2003/0025137 A1* | 2/2003 | Takahashi | H01L 21/76897 |
| | | | 257/E21.507 |
| 2003/0045093 A1* | 3/2003 | Givens | H01L 23/485 |
| | | | 438/644 |
| 2003/0068866 A1* | 4/2003 | Chen | H01L 29/665 |
| | | | 257/E21.334 |
| 2003/0113988 A1* | 6/2003 | Lee | H01L 29/66636 |
| | | | 257/E21.228 |
| 2003/0129831 A1* | 7/2003 | Hu | H01L 23/485 |
| | | | 438/655 |
| 2003/0216004 A1 | 11/2003 | Jeong et al. | |
| 2003/0236003 A1* | 12/2003 | Koo | H01L 21/76862 |
| | | | 438/653 |
| 2004/0005786 A1* | 1/2004 | Song | H01L 21/76897 |
| | | | 257/E21.507 |
| 2004/0014278 A1* | 1/2004 | Lee | H10B 12/0335 |
| | | | 257/E21.507 |
| 2004/0033684 A1* | 2/2004 | Li | H01L 21/76897 |
| | | | 257/E21.507 |
| 2004/0043542 A1* | 3/2004 | Park | H01L 21/76831 |
| | | | 257/E21.507 |
| 2004/0058548 A1 | 3/2004 | Sohn | |
| 2004/0082182 A1* | 4/2004 | Blosse | H01L 21/76813 |
| | | | 257/E21.507 |
| 2004/0101999 A1* | 5/2004 | Oda | H01L 21/28518 |
| | | | 438/151 |
| 2004/0121612 A1* | 6/2004 | Koh | H01L 21/76897 |
| | | | 257/E21.507 |
| 2004/0175955 A1* | 9/2004 | Haselden | H01L 29/6656 |
| | | | 257/E21.252 |
| 2004/0192026 A1* | 9/2004 | Chen | H01L 21/76855 |
| | | | 438/629 |
| 2004/0203211 A1* | 10/2004 | Yang | H01L 29/41791 |
| | | | 257/E21.507 |
| 2004/0235249 A1* | 11/2004 | Schaijk | H10B 43/30 |
| | | | 438/266 |
| 2005/0070098 A1* | 3/2005 | Bruley | H01L 21/76855 |
| | | | 438/655 |
| 2005/0140002 A1* | 6/2005 | Shin | H01L 21/76897 |
| | | | 257/E21.507 |
| 2005/0142690 A1* | 6/2005 | Lee | H01L 21/324 |
| | | | 257/E21.538 |
| 2005/0205110 A1* | 9/2005 | Kao | H01J 37/3244 |
| | | | 134/1.1 |
| 2005/0245073 A1 | 11/2005 | Lee et al. | |
| 2005/0277258 A1* | 12/2005 | Huang | H01L 21/823475 |
| | | | 257/E21.627 |
| 2006/0024882 A1* | 2/2006 | Lu | H01L 21/0206 |
| | | | 438/301 |
| 2006/0258091 A1 | 11/2006 | DeLoach et al. | |
| 2006/0263985 A1 | 11/2006 | Kang et al. | |
| 2007/0059931 A1* | 3/2007 | Park | H01L 21/76855 |
| | | | 257/E21.627 |
| 2007/0077736 A1* | 4/2007 | Yamaguchi | H01L 29/6653 |
| | | | 438/510 |
| 2007/0141836 A1* | 6/2007 | Yamauchi | H01L 29/7839 |
| | | | 438/651 |
| 2007/0197021 A1* | 8/2007 | Nam | H01L 21/76897 |
| | | | 438/622 |
| 2007/0216031 A1* | 9/2007 | Yang | H01L 21/76844 |
| | | | 257/E23.145 |
| 2007/0241199 A1 | 10/2007 | Yamazaki et al. | |
| 2007/0254442 A1* | 11/2007 | Manger | H01L 21/28247 |
| | | | 438/304 |
| 2007/0278599 A1* | 12/2007 | Hur | H01L 21/76897 |
| | | | 257/411 |
| 2008/0124922 A1* | 5/2008 | Kawamura | H01L 21/28518 |
| | | | 257/E21.477 |
| 2008/0157227 A1* | 7/2008 | Manabe | H01L 21/823475 |
| | | | 257/E21.627 |
| 2008/0191285 A1* | 8/2008 | Ko | H01L 29/66568 |
| | | | 257/E29.311 |

(56) References Cited

U.S. PATENT DOCUMENTS

| | | | |
|---|---|---|---|
| 2008/0269096 A1* | 10/2008 | Visintin | C11D 3/28 510/176 |
| 2008/0309581 A1 | 12/2008 | Fujii et al. | |
| 2009/0004856 A1* | 1/2009 | Kim | H01L 21/31116 438/675 |
| 2009/0079007 A1* | 3/2009 | Yamaguchi | H01L 29/045 257/370 |
| 2009/0104749 A1* | 4/2009 | Sung | H01L 21/76897 438/396 |
| 2009/0115002 A1* | 5/2009 | Tatsumi | H01L 21/823835 257/412 |
| 2009/0134388 A1* | 5/2009 | Yamauchi | H01L 21/823814 438/102 |
| 2009/0149020 A1 | 6/2009 | Hayashi et al. | |
| 2009/0191703 A1 | 7/2009 | Lu et al. | |
| 2009/0191705 A1* | 7/2009 | Liu | H01L 21/28518 438/653 |
| 2009/0236583 A1* | 9/2009 | Kuo | H10N 70/8828 438/54 |
| 2009/0321848 A1* | 12/2009 | Ichinose | H01L 21/76814 257/754 |
| 2009/0321942 A1 | 12/2009 | Sell et al. | |
| 2010/0041212 A1* | 2/2010 | Jinzu | C23C 16/0236 118/725 |
| 2010/0044774 A1* | 2/2010 | Kim | H01L 21/76831 257/321 |
| 2010/0117238 A1* | 5/2010 | Nemouchi | H01L 21/28518 257/754 |
| 2010/0224936 A1* | 9/2010 | Hokazono | H01L 21/76834 257/368 |
| 2010/0227472 A1* | 9/2010 | Futase | H01L 21/76876 438/653 |
| 2010/0291746 A1* | 11/2010 | Yoo | H01L 29/6653 438/303 |
| 2011/0057317 A1* | 3/2011 | Koike | H01L 21/28518 257/751 |
| 2011/0121410 A1* | 5/2011 | Liu | H01L 23/485 257/E23.164 |
| 2011/0260256 A1* | 10/2011 | Koide | H01L 21/76832 257/E27.06 |
| 2012/0025323 A1* | 2/2012 | Teo | H01L 29/401 257/E27.06 |
| 2012/0043592 A1* | 2/2012 | Zhao | H01L 21/76847 257/288 |
| 2012/0052661 A1 | 3/2012 | Sasagawa et al. | |
| 2012/0080757 A1* | 4/2012 | Kato | H01L 21/823814 438/231 |
| 2012/0083089 A1* | 4/2012 | Kim | H01L 29/7833 257/E21.409 |
| 2012/0098042 A1* | 4/2012 | Cai | H01L 21/2257 257/E21.409 |
| 2012/0139061 A1* | 6/2012 | Ramachandran | H01L 29/66545 438/586 |
| 2012/0146106 A1* | 6/2012 | Richter | H01L 21/76897 257/288 |
| 2012/0181586 A1* | 7/2012 | Luo | H01L 29/66545 257/288 |
| 2012/0211837 A1* | 8/2012 | Baars | H01L 21/823475 257/E27.06 |
| 2012/0273848 A1* | 11/2012 | Fan | H01L 21/823437 257/E21.409 |
| 2012/0313158 A1 | 12/2012 | Yin et al. | |
| 2013/0020616 A1 | 1/2013 | Ayala et al. | |
| 2013/0023100 A1* | 1/2013 | Park | H01L 21/02063 257/E21.423 |
| 2013/0043546 A1* | 2/2013 | Liu | H01L 21/28518 257/288 |
| 2013/0049219 A1 | 2/2013 | Tsai et al. | |
| 2013/0071981 A1 | 3/2013 | Huang et al. | |
| 2013/0092984 A1 | 4/2013 | Liu et al. | |
| 2013/0175583 A1* | 7/2013 | Yuan | H01L 29/4232 257/E21.585 |
| 2013/0175587 A1* | 7/2013 | Ramachandran | H01L 29/7833 257/288 |
| 2013/0193526 A1 | 8/2013 | Lo et al. | |
| 2013/0200461 A1* | 8/2013 | Liu | H01L 21/823871 257/E21.585 |
| 2013/0214362 A1* | 8/2013 | Nemouchi | H01L 21/823814 438/597 |
| 2013/0234261 A1* | 9/2013 | Wei | H01L 29/165 257/408 |
| 2013/0288468 A1 | 10/2013 | Chi | |
| 2013/0320452 A1* | 12/2013 | Wann | H01L 29/6656 257/368 |
| 2014/0021552 A1* | 1/2014 | Wang | H01L 29/7843 438/303 |
| 2014/0051239 A1 | 2/2014 | Breyta et al. | |
| 2014/0138750 A1* | 5/2014 | Wu | H01L 27/0207 257/288 |
| 2014/0147982 A1* | 5/2014 | Ogata | H01L 29/6659 438/303 |
| 2014/0154846 A1* | 6/2014 | Cheng | H01L 29/66742 438/151 |
| 2014/0197468 A1* | 7/2014 | Xie | H01L 29/6795 257/288 |
| 2014/0264494 A1* | 9/2014 | Xu | H01L 21/76843 257/288 |
| 2014/0306291 A1* | 10/2014 | Alptekin | H01L 29/41766 257/369 |
| 2014/0327080 A1* | 11/2014 | Hung | H01L 29/66795 257/365 |
| 2014/0353734 A1 | 12/2014 | Xie et al. | |
| 2014/0361364 A1* | 12/2014 | Chen | H01L 21/31111 257/336 |
| 2014/0361376 A1* | 12/2014 | Lii | H01L 29/45 257/369 |
| 2015/0035086 A1* | 2/2015 | Xie | H01L 23/53295 257/411 |
| 2015/0041868 A1* | 2/2015 | Cheng | H01L 21/28079 257/288 |
| 2015/0048428 A1* | 2/2015 | Cheng | H01L 29/41791 257/288 |
| 2015/0115335 A1 | 4/2015 | Wang et al. | |
| 2015/0187593 A1* | 7/2015 | Narushima | H01L 21/6708 438/735 |
| 2015/0187660 A1* | 7/2015 | Patzer | H01L 21/823864 438/217 |
| 2015/0228537 A1 | 8/2015 | Chang et al. | |
| 2015/0235897 A1* | 8/2015 | Fu | H01L 29/165 438/299 |
| 2015/0243663 A1 | 8/2015 | Hung et al. | |
| 2015/0249036 A1* | 9/2015 | Cai | H01L 21/76897 257/382 |
| 2015/0255556 A1* | 9/2015 | Cheng | H01L 29/7813 257/332 |
| 2015/0262870 A1* | 9/2015 | Lin | H01L 23/53238 438/653 |
| 2015/0263109 A1* | 9/2015 | Chen | H01L 21/26506 438/299 |
| 2015/0318243 A1* | 11/2015 | Lin | H01L 21/76843 438/653 |
| 2015/0325484 A1* | 11/2015 | Lin | H01L 21/265 438/301 |
| 2015/0364571 A1* | 12/2015 | Breil | H01L 21/28518 438/655 |
| 2015/0372099 A1 | 12/2015 | Chen et al. | |
| 2016/0013104 A1* | 1/2016 | Hung | H01L 29/41791 257/288 |
| 2016/0020303 A1 | 1/2016 | Jun et al. | |
| 2016/0043075 A1* | 2/2016 | Lavoie | H01L 27/088 438/300 |
| 2016/0043176 A1 | 2/2016 | Wang | |
| 2016/0043197 A1* | 2/2016 | Kim | H01L 21/31116 438/283 |
| 2016/0064516 A1 | 3/2016 | Lee et al. | |

(56) References Cited

U.S. PATENT DOCUMENTS

| | | | |
|---|---|---|---|
| 2016/0133480 A1* | 5/2016 | Ko | H01L 21/76897 438/690 |
| 2016/0233164 A1 | 8/2016 | Choi et al. | |
| 2016/0247689 A1* | 8/2016 | Or | H01L 21/31116 |
| 2016/0276283 A1* | 9/2016 | Zhang | H01L 27/0886 |
| 2016/0284817 A1* | 9/2016 | Basker | H01L 29/6656 |
| 2016/0293715 A1* | 10/2016 | Zang | H01L 21/76877 |
| 2016/0307758 A1 | 10/2016 | Li et al. | |
| 2016/0336270 A1* | 11/2016 | Chen | H01L 21/76865 |
| 2016/0351570 A1 | 12/2016 | Park et al. | |
| 2016/0351677 A1* | 12/2016 | Bao | H01L 21/0217 |
| 2016/0358908 A1* | 12/2016 | Xie | H01L 23/485 |
| 2016/0365426 A1* | 12/2016 | Ching | H01L 29/6653 |
| 2017/0011967 A1 | 1/2017 | Yeo et al. | |
| 2017/0018460 A1 | 1/2017 | Hsu et al. | |
| 2017/0047257 A1* | 2/2017 | Han | H01L 21/823418 |
| 2017/0084714 A1* | 3/2017 | Ching | H01L 29/66795 |
| 2017/0098707 A1* | 4/2017 | Hung | H01L 21/31116 |
| 2017/0098711 A1* | 4/2017 | Hsiao | H01L 29/785 |
| 2017/0103916 A1* | 4/2017 | Jeon | H01L 29/1608 |
| 2017/0103948 A1* | 4/2017 | Lee | H01L 29/41791 |
| 2017/0117224 A1* | 4/2017 | Adusumilli | H01L 23/535 |
| 2017/0125292 A1* | 5/2017 | Greene | H01L 23/535 |
| 2017/0162581 A1* | 6/2017 | Lai | H10B 10/12 |
| 2017/0170292 A1 | 6/2017 | Liu et al. | |
| 2017/0194203 A1* | 7/2017 | Hung | H01L 27/1104 |
| 2017/0200718 A1* | 7/2017 | Choi | H01L 29/6653 |
| 2017/0222014 A1 | 8/2017 | Tak et al. | |
| 2017/0287780 A1 | 10/2017 | Park et al. | |
| 2017/0294535 A1* | 10/2017 | Zhang | H01L 21/76877 |
| 2017/0323966 A1 | 11/2017 | Pradhan et al. | |
| 2017/0323971 A1* | 11/2017 | Tsai | H01L 29/665 |
| 2017/0330963 A1 | 11/2017 | Tsai et al. | |
| 2017/0365674 A1 | 12/2017 | Lee et al. | |
| 2017/0373161 A1* | 12/2017 | Schroeder | H01L 29/7851 |
| 2018/0040702 A1* | 2/2018 | Chang | H01L 29/66795 |
| 2018/0047634 A1* | 2/2018 | Jun | H01L 21/823481 |
| 2018/0068889 A1* | 3/2018 | Choi | H01L 21/76816 |
| 2018/0090438 A1* | 3/2018 | Kitamura | H01L 21/76883 |
| 2018/0151378 A1* | 5/2018 | Huang | H01L 29/7851 |
| 2018/0151678 A1* | 5/2018 | Li | H01L 29/785 |
| 2018/0151679 A1 | 5/2018 | Wang et al. | |
| 2018/0174904 A1* | 6/2018 | Hsieh | H01L 21/76831 |
| 2018/0174913 A1 | 6/2018 | More et al. | |
| 2018/0190659 A1 | 7/2018 | Chang et al. | |
| 2018/0277430 A1* | 9/2018 | Xie | H01L 29/6653 |
| 2018/0315647 A1* | 11/2018 | Wang | H01L 21/76802 |
| 2019/0115256 A1 | 4/2019 | Wang et al. | |
| 2019/0333915 A1* | 10/2019 | Lee | H01L 29/7851 |
| 2019/0393324 A1* | 12/2019 | Chen | H01L 29/66795 |
| 2022/0068712 A1* | 3/2022 | Chu | H01L 21/76814 |

OTHER PUBLICATIONS

Vega et al., Dopant-Segregated Schottky Junction Tuning With Fluorine Pre-Silicidation Ion Implant (Year: 2010).*

Vega et al., DSS MOSFET With Tunable SDE Regions by Fluorine Pre-Silicidation Ion Implant (Year: 2010).*

Jacques et al., Fluorine-enhanced boron diffusion in amorphous silicon (Year: 2003).*

Zhang et al., Metal silicides in advanced complementary metal-oxide-semiconductor (CMOS) technology (Year: 2014).*

Imbert et al., Impact of surface preparation on nickel-platinum alloy silicide phase formation, Microelectronic Engineering 84 (2007) 2523-2527 (Year: 2007).*

* cited by examiner

LOW RESISTANT CONTACT METHOD AND STRUCTURE

PRIORITY CLAIM

This application is a divisional of U.S. patent application Ser. No. 15/583,570, filed on May 1, 2017 and entitled "Low Resistant Contact Method and Structure", which claims the benefit of U.S. Provisional Application No. 62/427,716, filed on Nov. 29, 2016 and entitled "Low Resistant Contact Method and Structure," which application is incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins. Although existing FinFET devices and methods of fabricating FinFET devices have been generally adequate for their intended purposes, they have not been entirely satisfactory in all respects.

Low-resistant contacts are increasingly important since the total area available to create contacts is also being down-scaled as technology and manufacturing down-scale other aspects of semi-conductors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
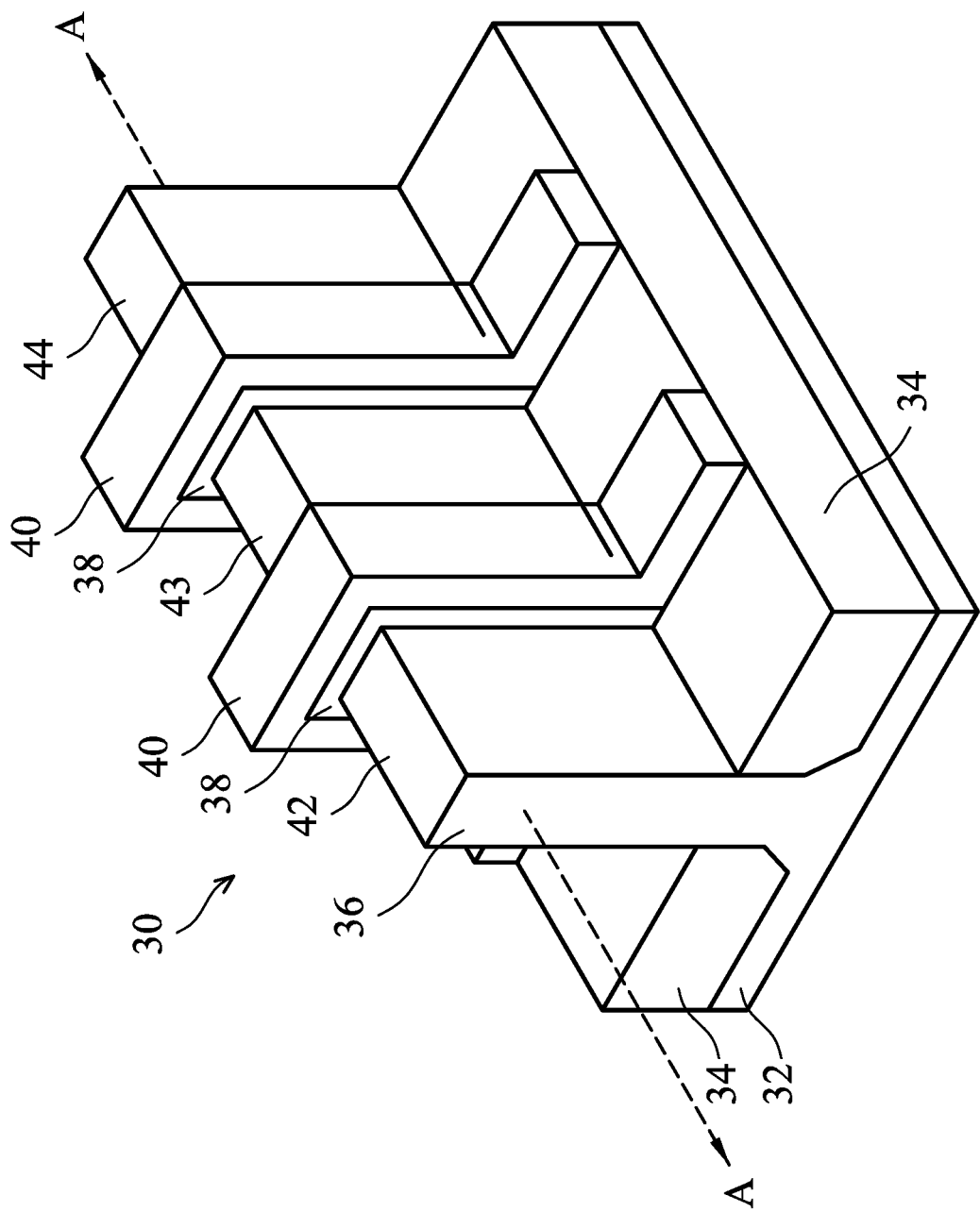
FIG. 1 is an example of a Fin Field-Effect Transistor (finFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide the ability to lower resistance of a contact. In general, one can lower resistance of a contact by improving the conductivity of contact by increasing the contact area of the contact or reducing the resistance of the contact materials. For example, some interconnects can use a seed layer to improve conductivity at an interface of two separate materials. In accordance with embodiments of the present disclosure, a silicide can be formed at the interface of two materials to increase conductivity (or lower resistivity) of the contact. In addition, in some embodiments, a pre-clean and chemical reaction can be applied to the contact interface, thereby causing an increase in both the width and depth of the silicide. A contact can be formed over the contact interface. Although the formation of the contact is explained in relation to a FinFET, one of ordinary skill in the art would understand that the application of the contact and contact formation structures and methods as discussed herein are not limited to use in a FinFET structure.

FIG. 1 illustrates an example of a FinFET 30 in a three-dimensional view. The FinFET 30 comprises a fin 36 on a substrate 32. The substrate 32 includes isolation regions 34, and the fin 36 protrudes above and from between neighboring isolation regions 34. The FinFET 30 contains two gates 38/40 in this example, however the FinFET could contain one gate or more than two gates. A gate dielectric 38 is along sidewalls and over a top surface of the fin 36, and a gate electrode 40 is over the gate dielectric 38. Source/drain regions 42 and 43 and 43 and 44 are disposed in the fin on opposite sides of the gate 38/40. FIG. 1 further illustrates a reference cross-section that is used in later figures. Cross-section A-A bisects the fin 36 along its length. Subsequent figures refer to this reference cross-section.

FIGS. 2 through 9 are cross-sectional views of intermediate stages in the formation of a contact in accordance with an example embodiment. Reference numerals used in the figures can include letters to distinguish a particular structure from another where otherwise they are equivalent, interchangeable, or functionally indistinguishable. Where such letters are used, the reference number without a corresponding letter indicates both/all of the particular structures. For example, a reference to 103 by itself would include a generalized structure corresponding to 103a, 103b, 103c, etc.

Figure 2:
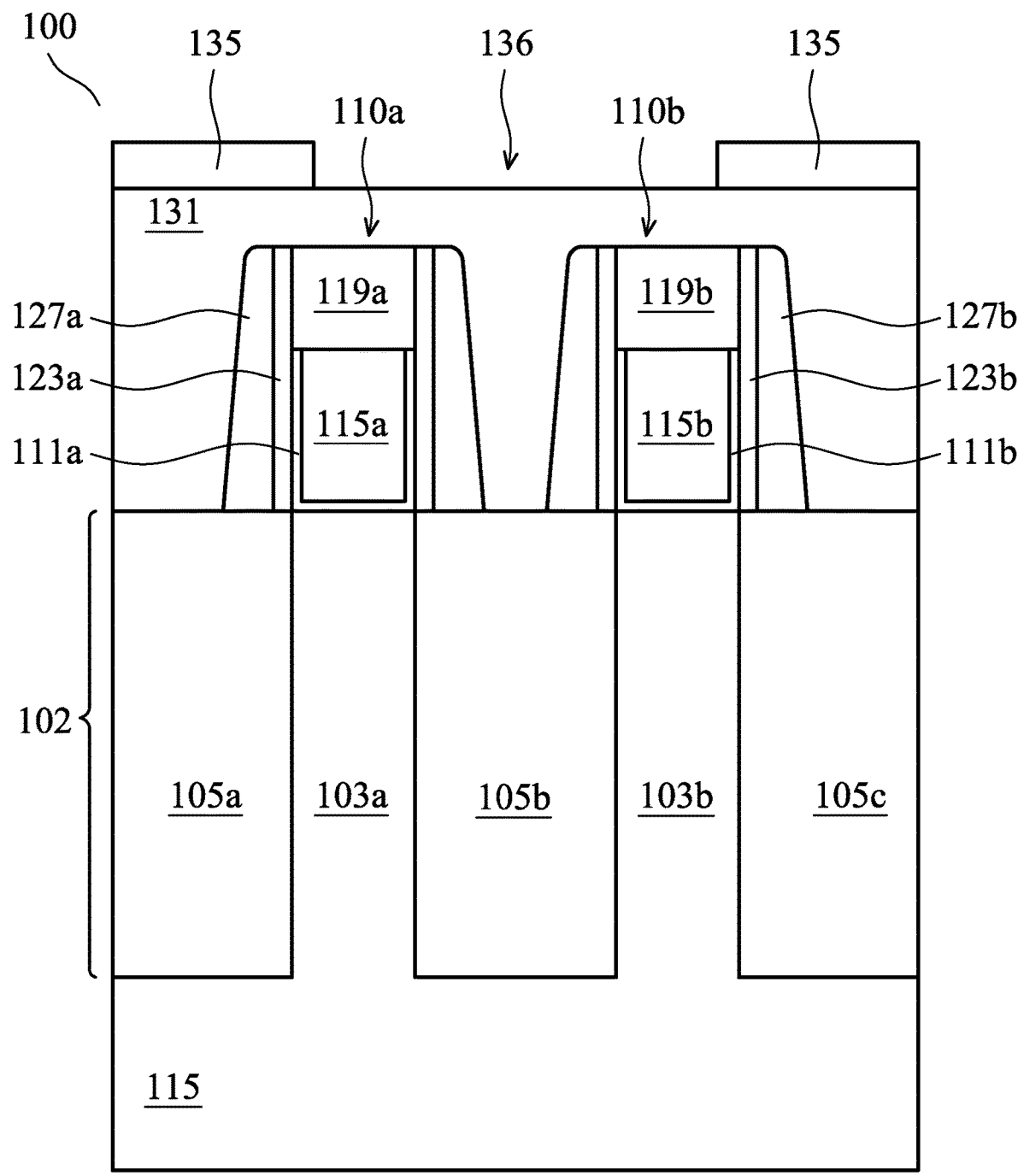
FIGS. 2-9 are examples of a FinFET at various stages of development, in accordance with some embodiments.
Figure 3:
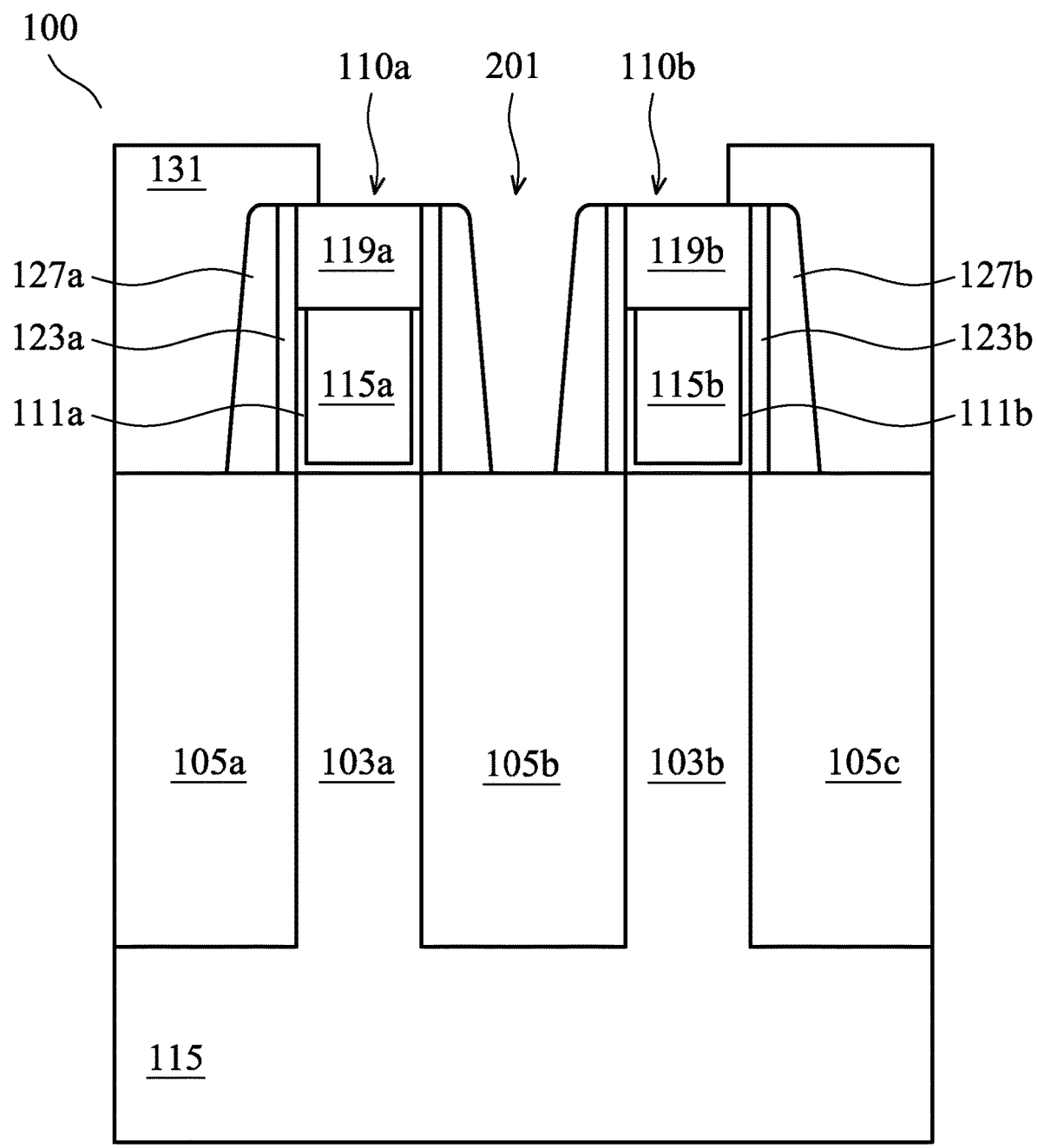

FIG. 2 includes a semiconductor device 100 having a semiconductor substrate 115, with fins 102 formed thereon. Semiconductor device 100 can be an active device such as a transistor, although other embodiments may include various other active and passive devices such as resistors, capacitors, inductors, diodes, varactors, the like, or a combination thereof. A fin, such as fin 36 of FIG. 1 or 102 of FIG. 3, is made of semiconductor fin material 103a/103b and source/drain material 105a/105b/105c. Semiconductor fin material 103a/103b can be formed from a semiconductor substrate 115. Semiconductor substrate 115 can be part of a semiconductor wafer or a semiconductor device. In accordance with some embodiments of the present disclosure, semiconductor substrate 115 includes crystalline silicon. Other materials that can be used in the substrate 115 include carbon, germanium, gallium, boron, arsenic, nitrogen, indium, and/or phosphorus, and the like. Semiconductor substrate 115 may also include other semiconductor materials such as III-V compound semiconductor materials. Semiconductor substrate 115 can be a bulk substrate or a Semiconductor-on-Insulator (SOI) substrate. Furthermore, the substrate 115 may include other features. For example, the substrate may include various doped regions depending on design requirements (e.g., p-type substrate or n-type substrate). For example, the doped regions may be doped with p-type dopants, such as boron or $BF_2$, n-type dopants, such as phosphorus or arsenic, and/or combinations thereof. The doped regions may be configured for an n-type FinFET, or alternatively configured for a p-type FinFET.

In accordance with some embodiments, one or more gate stacks 110 can be formed over the semiconductor fins 102. Semiconductor fins 102 includes source/drain material 105a/105b/105c and semiconductor fin material 103a/103b. Gate stacks 110 can comprise a metal gate electrode 115a/115b, a gate insulator or dielectric 111a/111b, an optional first gate spacer 123a/123b, a second gate spacer 127a/127b, and a self-aligned contact/hardmask 119a/119b formed over the metal gate 115a/115b.

In some embodiments, gate stacks 110 can be formed using a gate-first approach, while in other embodiments gate structures 110 can be formed using a gate-last approach. Gate stacks 110a and 110b are formed over the substrate 103a/103b.

In some embodiments dummy gate stacks can be formed first. The dummy gate stacks can include a dummy gate dielectric, a hard mask, and a dummy gate electrode. The dummy gate stacks can be replaced by gate stacks 110a/110b. The dummy gate electrode and dummy gate dielectric can be etched and removed. Gate dielectric 111a/111b can be deposited conformally in recesses left by removal of dummy gate electrode and dummy gate dielectric. Gate dielectric layers 111a/111b can comprise silicon oxide, silicon nitride, or multilayers thereof. In some embodiments, gate dielectric layers 111a/111b include a high-k dielectric material, and may include a metal oxide or a silicate of Hf, Al, Zr, La, Mg, Ba, Ti, Pb, and combinations thereof. The formation methods of gate dielectric layers 111a/111b may include molecular-beam deposition (MBD), ALD, PECVD, and the like.

Gate electrodes 115a/115b are deposited over gate dielectric layers 111a/111b, respectively, and fill the remaining portions of the recesses. Gate electrodes 115a/115b may be made of a metal-containing material such as TiN, TaN, TaC, Co, Ru, Al, combinations thereof, or multi-layers thereof. After the filling of gate electrodes 40, a planarization process, such as a CMP process, may be performed to remove excess portions of gate dielectric layers 111a/111b and the material of gate electrodes 115a/115b. The gate electrodes 115a/115b and the gate dielectrics 111a/111b are recessed in one or more etching steps so that recesses are formed within the gate spacers 123/127. An acceptable etching process can be used, such as one that is selective to the materials of the gate electrodes 115a/115b and the gate dielectrics 111a/111b. The recesses allow for subsequently formed hard masks 119a/119b to be formed within the recesses to protect the replacement gates 115a/115b.

A hard mask 119a/119b is formed within the recesses over gate electrodes 115a/115b and the gate dielectrics 111a/111b. The hard mask 119a/119b can be made of SiN, SiON, $SiO_2$, the like, or a combination thereof. The hard mask 119a/119b can be formed by CVD, PVD, ALD, a spin-on-dielectric process, the like, or a combination thereof.

Source/drain regions 105a/105b/105c can be formed in the substrate 115. Source/drain regions 105a/105b/105c can be formed after the formation of the dummy gate stacks or after the formation of the gate stacks 110a/110b. In some embodiments, the source/drain regions 105a/105b/105c may be doped by performing an implanting process to implant appropriate dopants to complement the dopants in the substrate 115. In other embodiments, the source/drain regions 105a/105b/105c can be formed by forming recesses (not shown) in substrate 115 and epitaxially growing material in the recesses. The recesses may be formed by etching using any acceptable etch process, such as a RIE, NBE, tetramethylammonium hydroxide (TMAH), ammonium hydroxide ($NH_4OH$), a wet etchant capable of etching silicon with good etch selectivity between silicon and a material of isolation regions (not shown), the like, or a combination thereof. The etch may be anisotropic. The etching of the semiconductor fins 102 may be performed in a single etch process or multiple etch processes. The source/drain regions 105a/105b/105c can be formed in the recesses by epitaxially growing a material 105a/105b/105c in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof.

The source/drain regions 105a/105b/105c may be doped either through an implantation method as discussed above, or else by doping in place as the material is grown. Epitaxial source/drain regions 105a/105b/105c may include any acceptable material, such as appropriate for n-type FETs and/or p-type FETs. For example, in an n-type configuration, if the substrate 115 is silicon, the epitaxial source/drain regions 105a/105b/105c may include silicon, SiC, SiCP, SiP, or the like. For example, in an n-type configuration, if the substrate 115 is silicon, the epitaxial source/drain regions 105a/105b/105c may include SiGe, SiGeB, Ge, GeSn, or the like. Epitaxial source/drain regions 105a/105b/105c may have surfaces raised above top surfaces of the substrate 115 and may have facets.

After the FinFET is formed, in some embodiments, a dielectric layer 131 can be formed over the structure. Contacts can be formed in the dielectric layer to electrically couple the gate and source/drain regions to other devices or structures. In some embodiments, dielectric layer 131 can include multiple layers.

Element 135 of FIG. 2 illustrates the addition of a photoresist layer or silicon oxide resist layer 135 that is deposited over substrate 115 and then patterned, thereby forming openings 136 in the resist layer 135. Generally, photolithography techniques utilize a photoresist material (such as photo resist 135) that is deposited, irradiated (exposed), and developed to remove a portion of the photoresist material. The remaining photoresist material protects the underlying material, such as the dielectric 131 in this example, from subsequent processing steps, such as etching. In this example, the photoresist material is patterned to define an area that will be etched and, conversely, an area that will be protected from etchant. In embodiments where a dielectric 131 was not used, then a photoresist 135 is not used.

Notably the opening 136 can be wider than a width between the gate structures 110a/110b. Or in other words, the opening 136 does not have to be precisely over the gate structures 110a/110b. In some embodiments, the opening 136 can span multiple gate stacks.

FIG. 3 illustrates a cross-section of the FinFET after etching the dielectric that was left exposed by the photo resist mask 135. Etching the dielectric can be done by any suitable technique, for example, using a wet or dry etchant that is selective to the dielectric material 131. Following the etching, the photoresist 135 can be removed. The etching forms an opening 201 between the gate structures 110a/110b, and the top of the source/drain 105b is exposed.

When the source/drain 105b is exposed, an oxide can form. For example, if the source/drain 105b is silicon-based, the top of the source/drain 105b can have silicon oxide (SiO) at the top of the fin. An oxide can interfere with the formation of a contact on the source/drain 105b by causing an increased resistivity. Therefore, the oxide can be cleaned/removed prior to formation of the contact.

Figure 4:
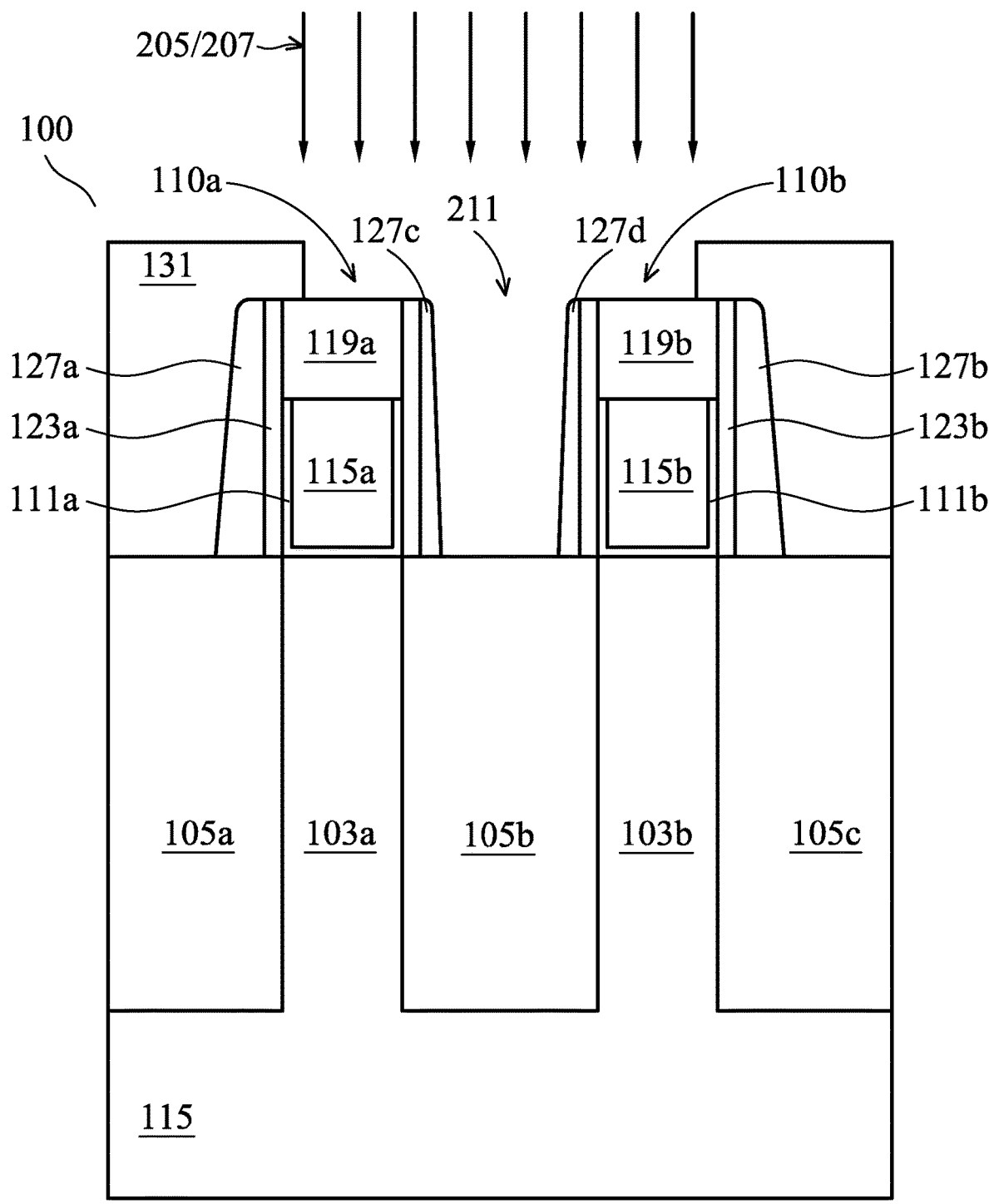

FIG. 4 illustrates a pre-clean process 205 and physical bombard 207. A pre-clean process is performed 205 using argon (Ar) gas as cleaning etchant. Other cleaning etchants can be used, such as NF3, NH3, H2, N2, mixed gas Ar/H2, and Ar/N2. A physical bombard 207 can be performed subsequent to, alternating with, or simultaneously with the pre-clean process 207.

In some embodiments, an RF generator (not pictured) can be used in an etching chamber (not pictured) or in the deposition chamber (not pictured) to create a plasma using a power up to about 1.5 kW, such as about 200 W. In other embodiments, the power can be increased up to about 1.5 kW, such as to about 400 W. In the pre-clean process 205, the chamber is filled with Ar gas and the opening 201 is exposed to the plasma generated within the etching chamber. In the physical bombard 207 process a bombard material can be added to the etching chamber. The bombard material can be chlorine gas, fluorine gas, ammonia gas, or a combination thereof. The opening 201 is exposed to the plasma. When the opening 201 is exposed to the pre-clean process and bombard material, the opening 201 will widen to the opening 211. The opening 211 has side walls comprised of the gate spacers 127c/127d, which have been thinned in the clean etching/physical bombard processes.

In accordance with some embodiments, the physical bombardment is performing using a process gas as the bombard material as described above. Other process gasses may be present, including argon, helium, nitrogen ($N_2$), hydrogen ($H_2$), xenon, arsenic, germanium, phosphorous, and the like. Ions are generated from the bombard material and used to bombard the opening 201. The bombardment is performed in a vacuumed environment (such as an etching chamber). The flow rate of the process gas may be in the range between about 1 sccm and about 20,000 sccm. The pressure of the process gas may be in the range between about 0.1 mtorr and about 1 torr. The bias may be between about 20 eV and about 5 KeV. The duration of the bombardment may be between about 1 second and about 90 seconds.

The surface regions that are bombarded include the top surface of source/drain 105b and the gate spacer surfaces 127c/127d. The gate spacers and source/drain 105b can include a native oxide. As a result of the bombardment, surface regions become rougher and the gate spacers 127c/127d are thinned. In addition, the bonds of the materials (such as oxides) in the bombarded surface regions may be broken or loosened. As a result, the bombarded surface regions may adsorb more process gases in a subsequent chemical reaction step.

In the bombardment, the ions may be implanted into source/drain regions 105b. The implanted ions can have the function of reducing the resistance between the subsequent formed silicide regions as well as contact plugs and source/drain regions 105b. This may reduce the contact resistance of the contact plugs. The contact resistance may further be adjusted by adjusting the type of bombardment ions and the energy of the bombardment.

In the physical bombard process 207, a chemical reaction will take place at the exposed surface of the source/drain region 105b between the bombard material and the source/drain region 105b, and the bombard material will be incorporated into the top part of the source/drain region 105b. For example, where ammonium fluoride gas is used as bombard material, ammonium fluoride can react with silicon oxide, resulting in ammonium fluorosilicate compound. The physical bombard process 207 can include multiple cycles to provide multiple gas reactions. The gas injection can be tunable according to the plasma process to inject gas by particular zones across the bottom of the opening 211.

The pre-clean process 205 and physical bombard 207 can be performed simultaneously by filling the etching chamber with a gas cleaning etchant (e.g., argon gas) and a physical bombard material (e.g., chlorine, fluorine, ammonia, or combination thereof) at the same time. Additional gases can be present, including hydrogen and nitrogen gases.

Figure 5:
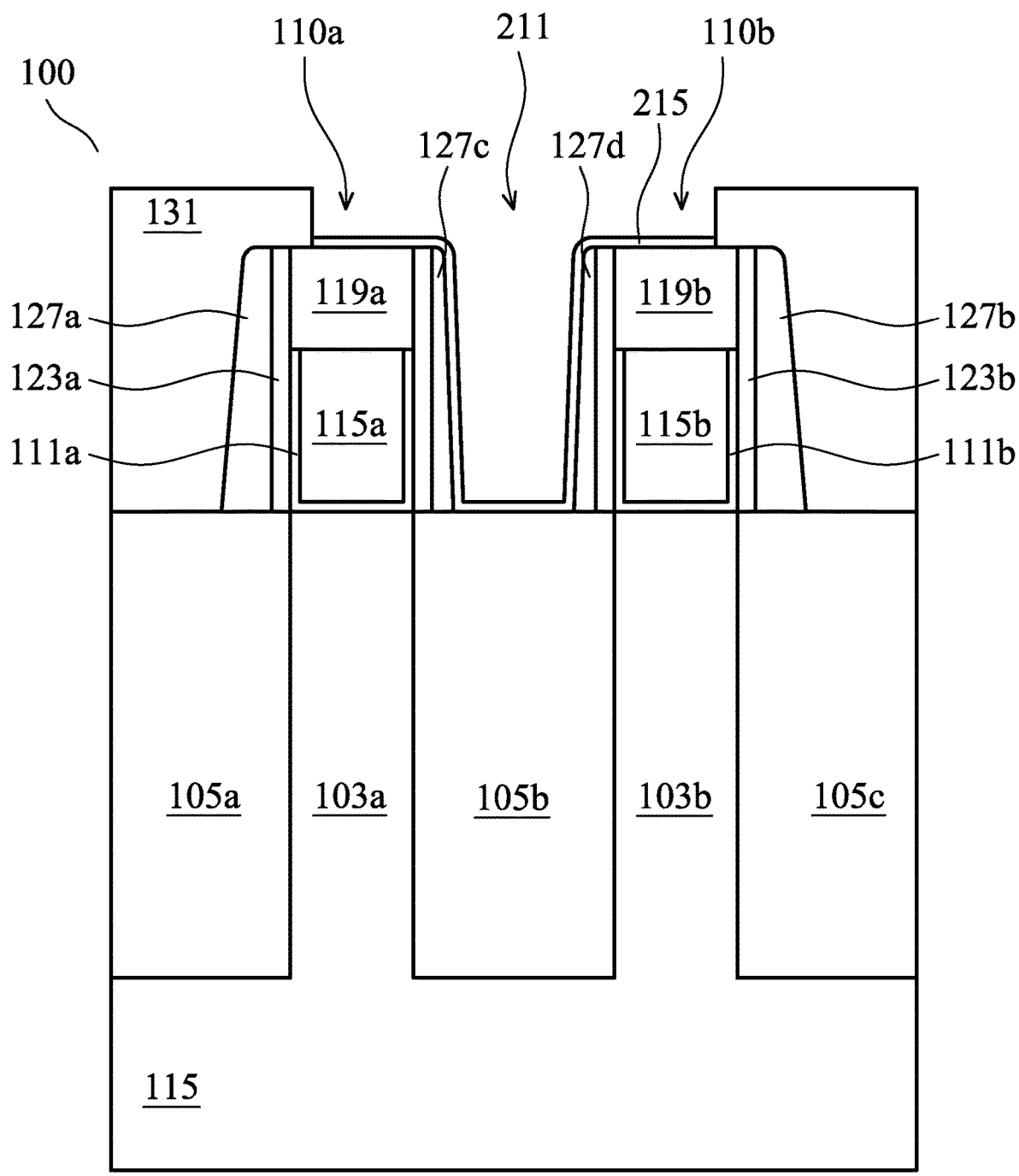

Referring to FIG. 5, a metal layer 215 can be formed on the exposed surfaces of the opening 211. In some embodiments, the metal layer 215 will be substantially consumed by the subsequent process of forming the metal-silicide layer 225 of FIG. 7. The metal layer 215 may be formed of titanium, nickel, cobalt, tungsten, platinum, molybdenum, tantalum, the like, or a combination thereof. As illustrated in FIG. 5, the metal layer 215 includes a portion at the bottom of the opening in contact with the top surface of the source/drain region 105b, portions extending along sidewalls of the opening 211, and portions extending over the gate stacks 110a/110b. In some embodiments, the metal layer 215 can also extend over the dielectric 131. In some embodiments, the metal layer 215 is formed by PVD, CLD, ALD, sputter deposition, the like, or a combination thereof to a thickness from about 30 Å to about 200 Å. In some embodiments, deposition by PVD, CLD, ALD, or sputter can be performed while applying a bias by an RF generator. The metal layer 32 may be conformally deposited to have a substantially uniform thickness along the bottom and sidewalls of the opening 211 and over the gate stacks 110a/110b.

Figure 6:
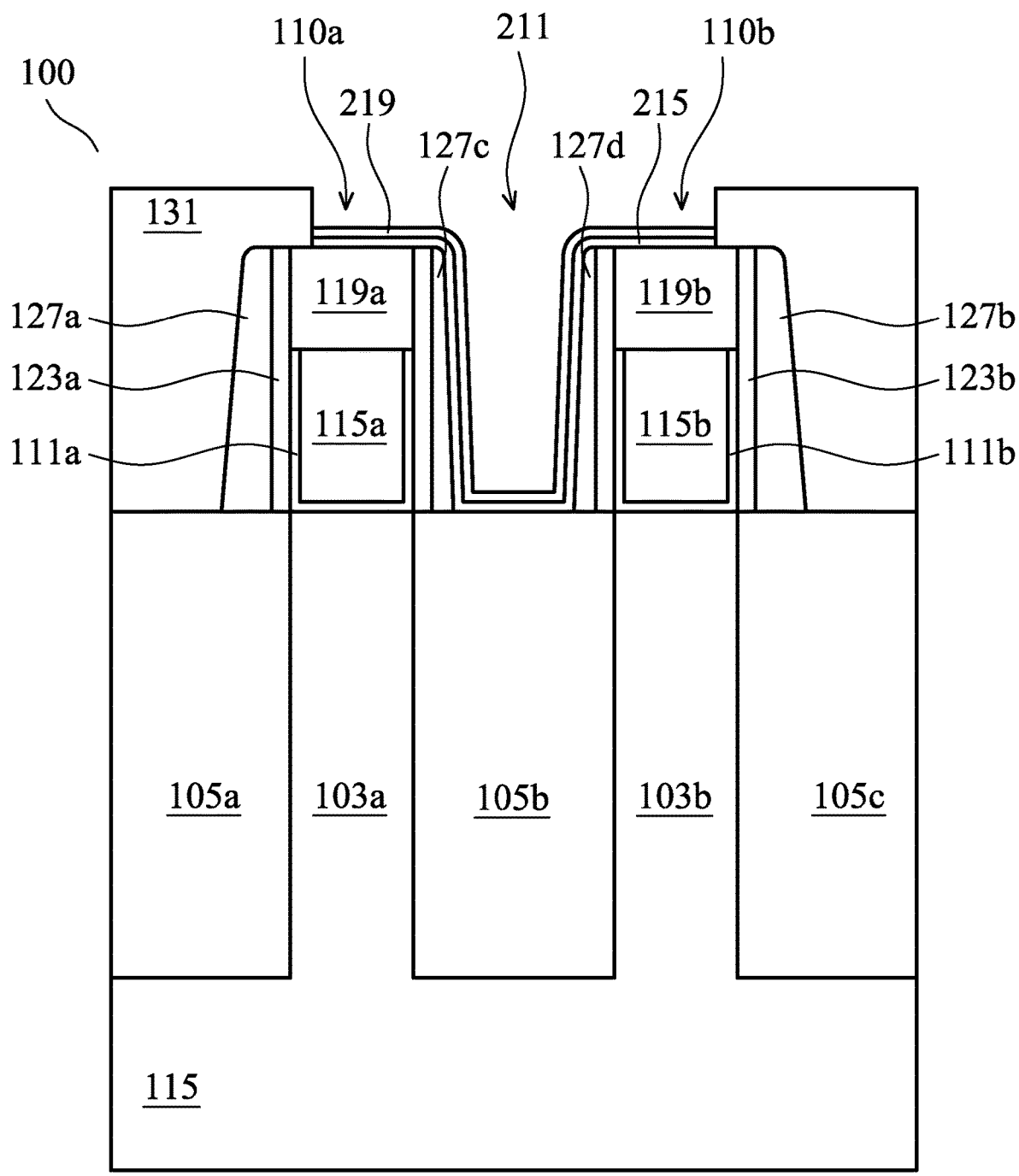

Referring to FIG. 6, a cap layer 219 is formed over the metal layer 215 and in the opening 211. The cap layer 219 improves the adhesion between the subsequently formed conductive plug 229 of FIG. 7 and also prevents oxidation of the metal layer 225. The cap layer 219 also acts as a barrier layer to aid the silicide formation. The cap layer 219 helps stabilize the metal layer 215 and prevents penetration of the metal layer 225 to conductive plug 229. The cap layer 219 can be formed of multiple layers. The cap layer 219 may be formed of titanium nitride, tantalum nitride, the like, or a combination thereof. As illustrated in FIG. 6, the cap layer 219 includes a portion at the bottom of the opening 211, portions extending along sidewalls of the opening 211, and portions extending over the gate stacks 110a/110b. In some embodiments, portions of the cap layer 219 can extend over the dielectric 131. In some embodiments, the cap layer 219 is formed by a single or multi cycle of CVD, PVD, ALD, the like, or a combination thereof to a thickness from about 5 Å to about 50 Å. The cap layer 219 may be conformally deposited to have a substantially uniform thickness along the bottom and sidewalls of the opening 211 and over the gate stacks 110a/110b.

Figure 7:
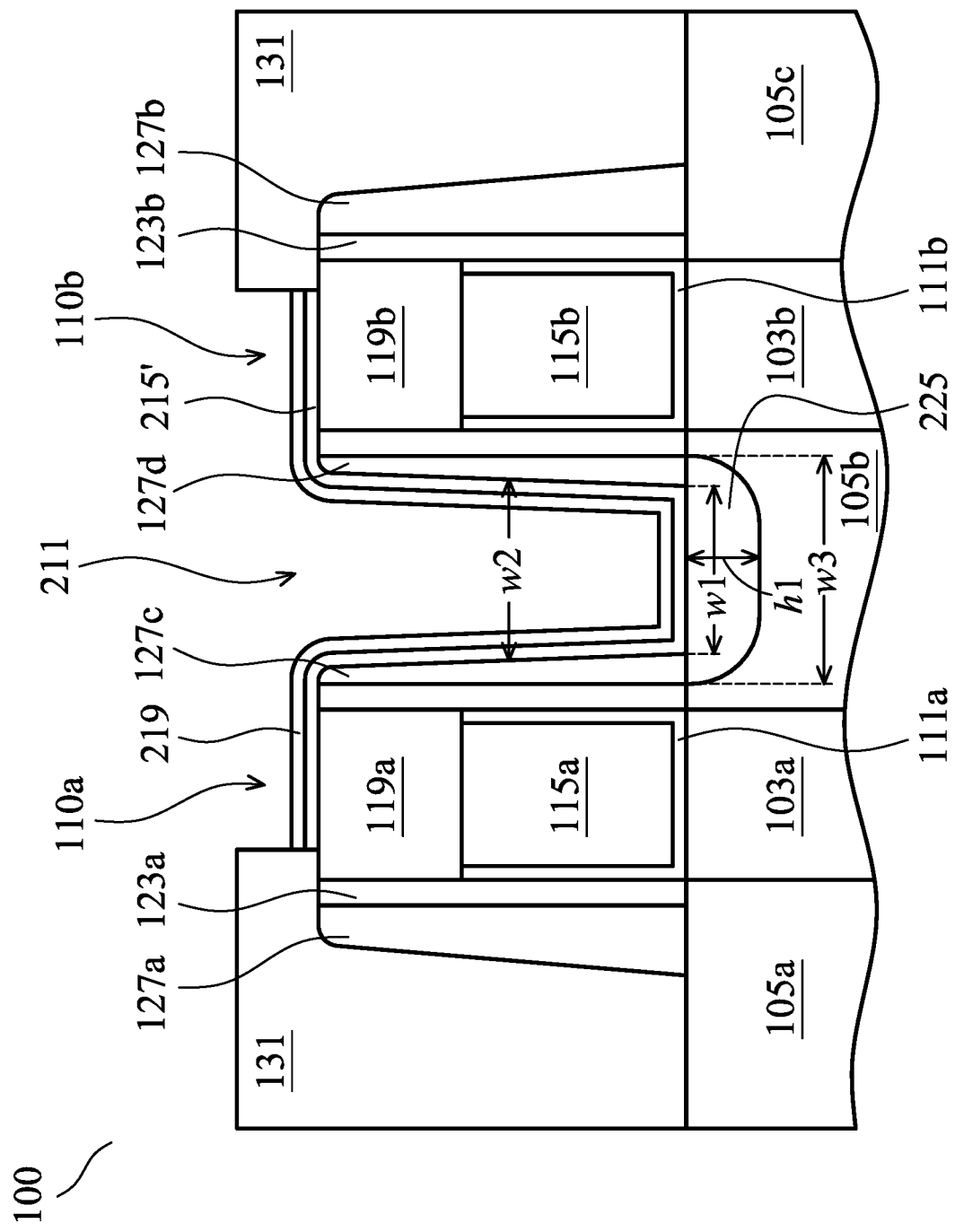

Referring to FIG. 7, a silicidation process forms the metal-silicide layer 225 from the metal layer 215. The formation of the metal-silicide layer 225 includes performing an annealing process on the semiconductor device 100. The annealing process causes the bombard material and bombarded source/drain region 105b to react with the metal layer 215 to form the metal-silicide layer 225. In some embodiments, the annealing process is performed using a rapid thermal anneal, thermal soaking, spike annealing, flash annealing, laser annealing, microwave annealing, the like, or a combination thereof. In some embodiments, the annealing process is performed at a temperature from about 100° C. to about 900° C., in an atmosphere including process gases such as $N_2$, $NH_3$, $H_2$, a mixing gas, the like, or a combination thereof, and at a pressure from 1 Torr to about 760 Torr.

In some embodiments, the anneal chamber can include a heater stage (not pictured) to hold the wafer that can be heated to a temperature from about 30° C. to about 120° C. The anneal chamber can be a plasma etching chamber having a shower head style chamber lid (not pictured) for delivering process gasses to a plasma etching chamber, where the lid also has an anneal function, such as an anneal function described above.

After the metal-silicide layer 225 is formed, in some embodiments, portions of the metal layer 215' can remain that were not converted into the metal-silicide layer 225.

As illustrated in FIG. 7, the metal-silicide layer 225 includes a depth h1 and width w3. The chemical reaction of the bombard material with the top of fin 105b helps the metal-silicide layer 225 form at a greater width and depth than it would be able to form without the chemical reaction. In some embodiments, the width w1 can be in a range of about 10 nm to about 20 nm. The width w2 can be in a range of about 15 nm to about 25 nm. The width w3 can be in a range of about 15 nm to about 30 nm. In some embodiments, the ratio of w3 to w1 increases by about 6% or more. In some embodiments, the silicide depth h1 is greater than about 6 or 7 nm. The bombardment of the bombard material with the bottom of the opening 211 can increase the pitch of the sidewalls of the contact opening 211 such that they are more vertical than before the bombardment. Where the sidewalls are gate spacers of the adjacent gate structures, the gate spacers of the opening 211 sidewall, such as gate spacers 127c and 127d, can be more vertical and thinner than the corresponding (i.e., positionally mirrored) gate spacers 127a and 127b, respectively, of the gate stacks. In some embodiments, the dimension ratio of the width w1 of the opening 211 to the width at the bottom w2 of the opening 211 is greater than about 90%.

Figure 11:
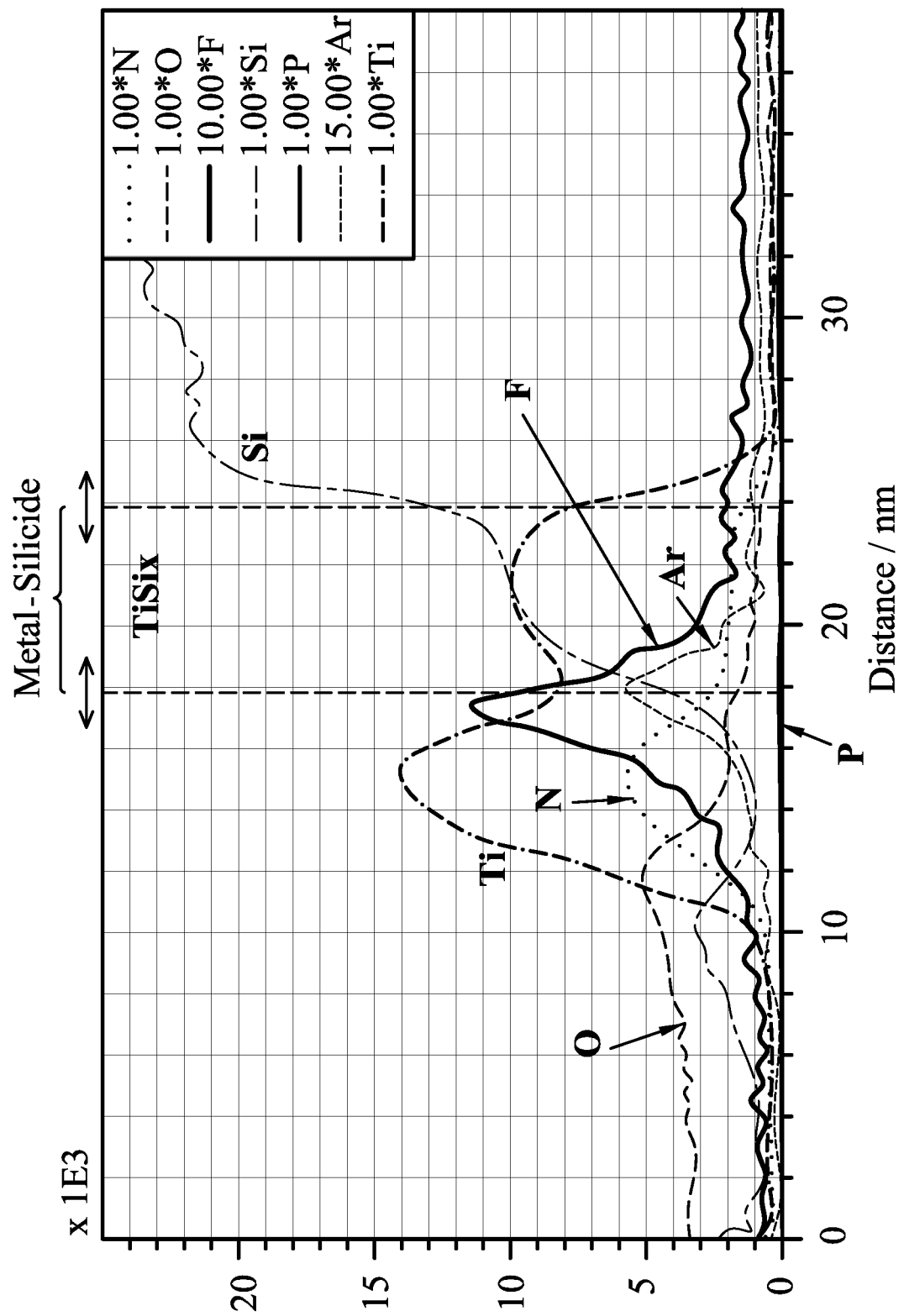
FIG. 11 illustrates a chemical index chart of a metal-silicide area of a source/drain contact in accordance with some embodiments

After the metal-silicide layer 225 is formed, the element concentrations of the bombard material (e.g., fluorine or chlorine) can be found in a chemical index at the interface of metal layer 215' and the metal-silicide layer 225. FIG. 11, discussed below, shows the relationship between these elements, using fluorine as being representative. A first concentration of the bombard material can be found at the interface of metal layer 215' and the metal-silicide layer 225, near the top of metal-silicide layer 225. The first concentration of can be a peak concentration of the bombard material in the metal-silicide layer 225. The silicidation process forming metal-silicide layer 225 can also cause the bombard material to leech back into the metal layer 215'. Thus, in some embodiments, the bombard material can be found in a chemical index at the metal layer 215'. Moving further into the metal-silicide layer 225, the chemical index for the bombard material will decrease until it becomes a trace amount. In some embodiments, at a depth of about half the silicide depth, the bombard material will exist in trace amounts. A second concentration of the bombard material can begin at a depth of about half the silicide depth and continue throughout the remaining metal-silicide layer 225 at about the same concentration.

Figure 8:
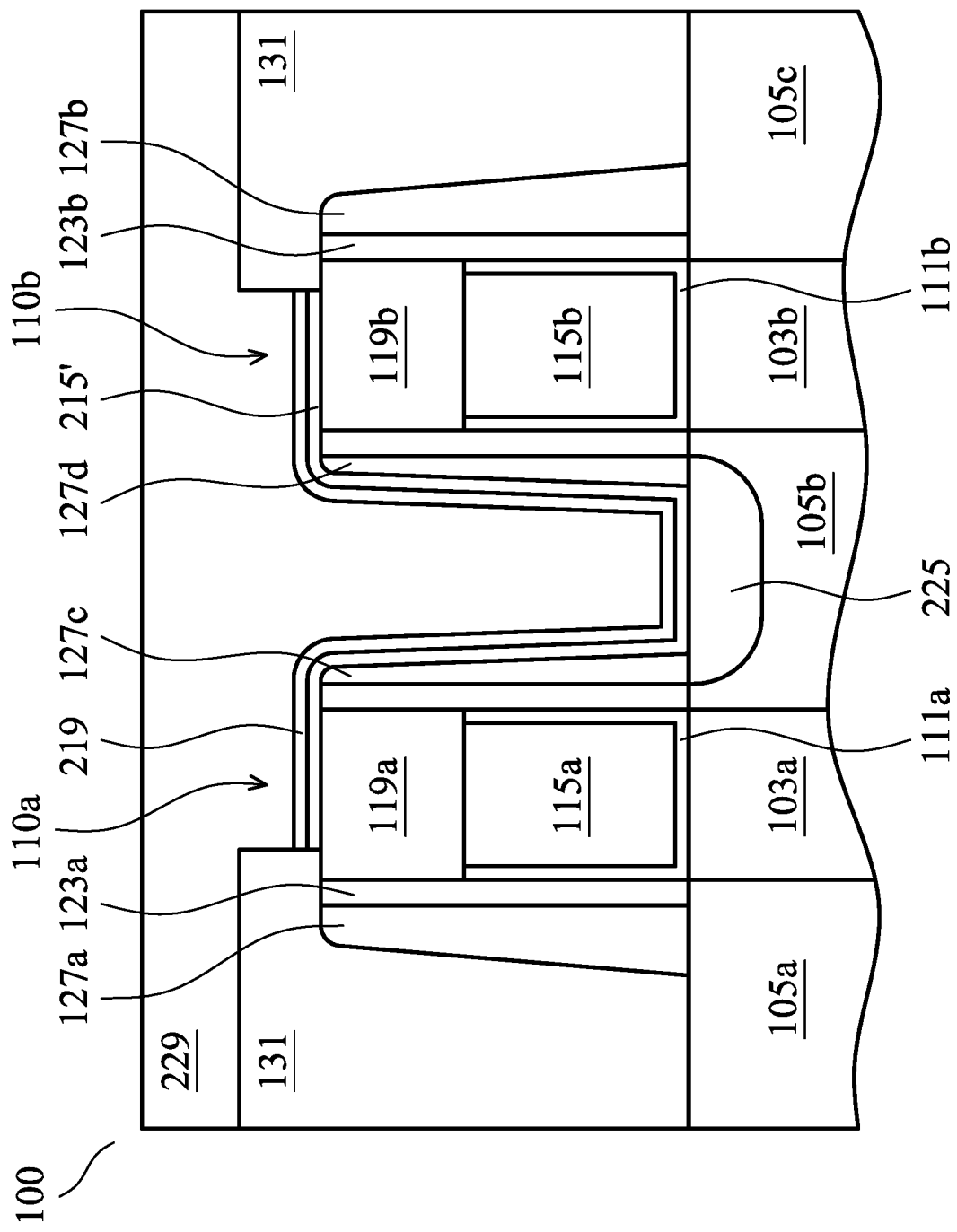

Referring to FIG. 8, the opening 211 of FIG. 7 can be filled with a conductive material 229. In some embodiments, the conductive material 229 fills the opening 211 and also extends over the dielectric layer 131. In some embodiments, the conductive material 229 can fill the opening 211 and not extend over the dielectric layer 131. The conductive material 229 comprises will form the subsequently formed conductive plug 229' of FIG. 9. The conductive material 229 includes any appropriate metal or metal alloys such as tungsten, aluminum, copper, titanium nitride, tantalum nitride, the like, or a combination thereof. The formation of the conductive material may be performed using CVD, ALD, PVD, sputtering, the like, or a combination thereof. The conductive material 229 can be formed in multiple steps through the deposition of multiple layers.

Figure 9:
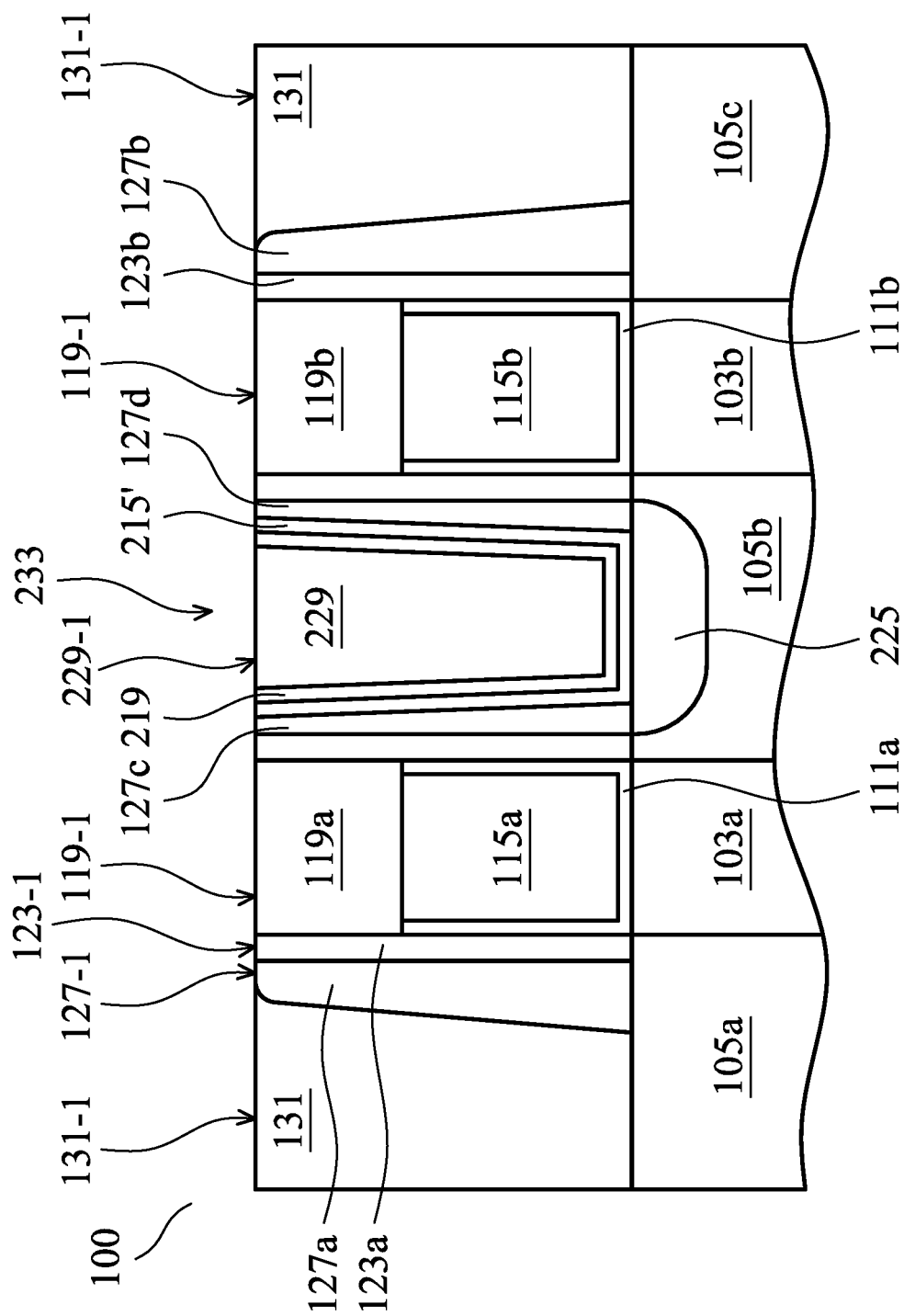

Referring to FIG. 9, a planarization process may be performed on the conductive material 229 to form the conductive plug 229'. In some embodiments, the planarization process is a chemical mechanical polishing (CMP) process, an etching process, the like, or a combination thereof. After the planarization process, the top surface 229-1 of the conductive plug 229' is substantially coplanar with the top surface 131-1 of the dielectric layer 131, the top surface 119a-1/119b-1 of the gate hardmask 119a/119b, the top surface 123-1/127-1 of the gate spacers 123/127, the uppermost surface of metal layer 215', and the uppermost surface of the cap layer 219. The metal-silicide layer 225, the unreacted metal layer 215' (if present), the cap layer 219, and the conductive plug 229' form the contact structure 233.

In some embodiments source/drain regions 105a/105c can be silicided subsequently or at the same time as the source/drain region 105b and a corresponding contact structure formed therein. Source/drain regions 105a/105c can be silicided using the same process as described above with respect to source/drain region 105b. The details are not repeated here.

In some embodiments, a gate contact can be formed over the gate stacks 110a/110b. In some embodiments, the silicidation process described above can be used to form a gate silicide for a gate contact. In some embodiments, the silicidation process described above can be used to form contacts for other types of semiconductor devices, such as other types of transistors, nano-wire transistors, and interposers.

Figure 10:
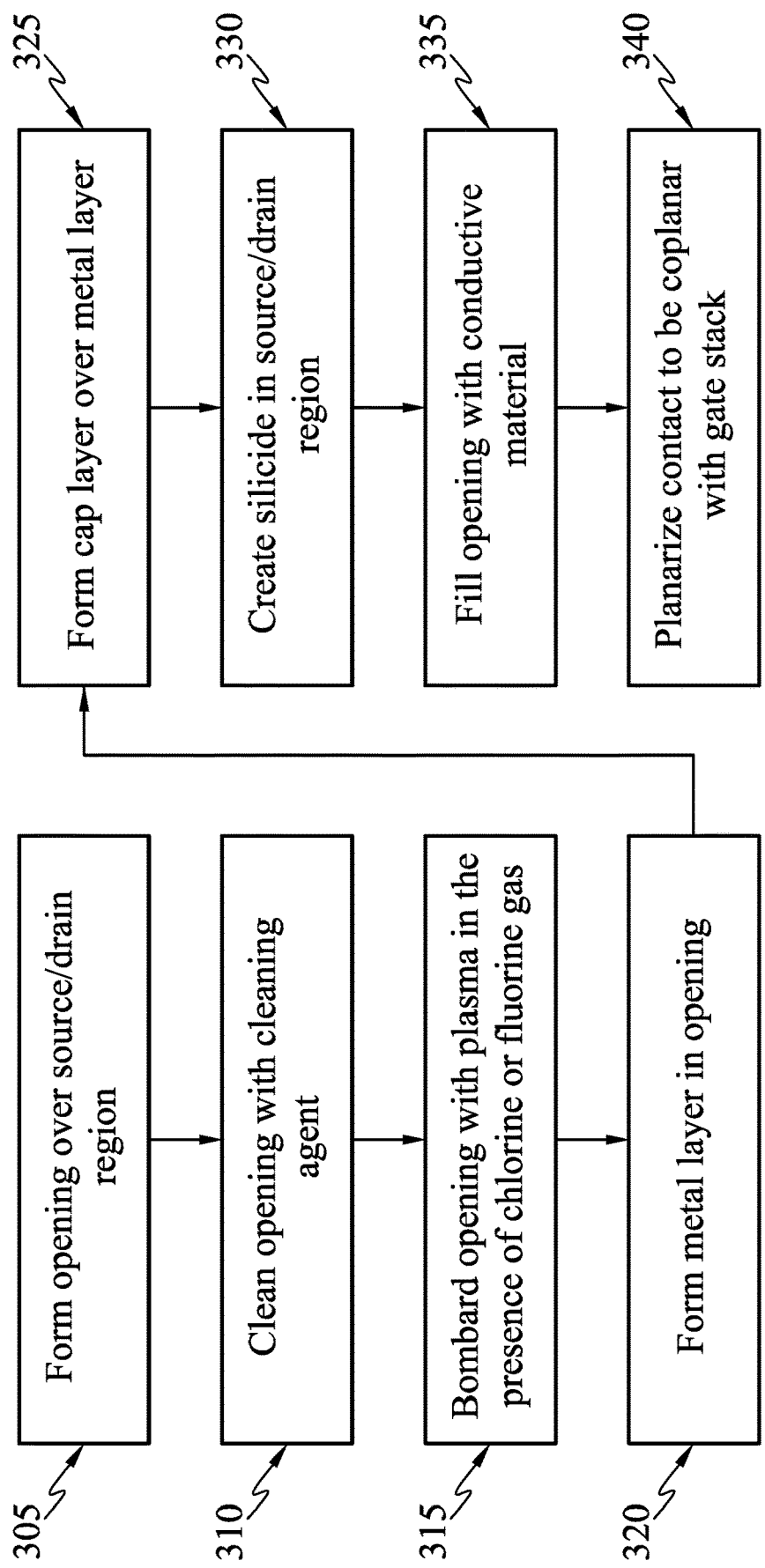
FIG. 10 is a flow diagram, in accordance with some embodiments.

FIG. 10 illustrates a flow diagram in accordance with some embodiments. After source/drain regions have been formed, such as source/drain regions 105a/105b/105c of FIG. 2, and after gate stacks have been formed, such as gate stacks 110a/110b, at 305 an opening is formed over the source/drain region(s).

At 310, the opening or openings are cleaned using a cleaning agent. In some embodiments the cleaning agent can be argon gas and plasma for etching the opening to remove any residual oxides or dielectric materials, such as residuals from dielectric material 131 of FIG. 3.

At 315, the opening or openings are bombarded with a bombard material. The bombard material can be chlorine, fluorine, or a combination thereof. Plasma can be generated by an RF generator as discussed above. In some embodiments, steps 310 and 315 can be done simultaneously. In some embodiments, steps 310 and 315 can be alternatively repeated. In some embodiments, the cleaning and physical bombard can be repeated around 1 to 5 times. In some embodiments, the cleaning and physical bombard can be repeated more times, such as 10 or 20 times. By way of the cleaning and physical bombard, gate spacers forming sidewalls of the opening can be thinned.

At 320, a metal layer is formed in the opening. The forming of the metal layer is discussed in detail above in connection with FIG. 5 and is not repeated here.

At 325, a cap layer is formed over the metal layer. The forming of the metal layer is discussed in detail above in connection with FIG. 6 and is not repeated here.

At 330, a silicide is formed in the source/drain region. Because of the reaction of the bombard material at the surface of the source/drain region, the silicide formation can be wider and deeper than it would have been otherwise. For example, the silicide can include an area under the gate spacers. The forming of the silicide is discussed in detail above in connection with FIG. 7 and is not repeated here.

At 335, the opening is filled with a conductive material. At 340, the conductive material is planarized to be substantially coplanar with the gate stacks.

FIG. 11 illustrates a chemical index chart of the metal-silicide area 225 in accordance with some embodiments. Vertical dashed lines are located in on the chart in the approximate area defined as the metal-silicide region. Each of the dashed lines is approximate and can be understood to be in a range as indicated by the arrows above each dashed line. The chemical index shows titanium and silicon forming a metal-silicide region. Also present in the metal-silicide region is fluorine, which was used in this example as the bombard material. The anneal process for forming the silicide can cause bombard material to leech or diffuse back into the metal layer 215' and capping layer 219. Thus, a concentration of bombard material can also be found in the metal layer 215' and capping layer 219. The bombard material has its peak concentration in the metal-silicide layer at the uppermost portion or surface of the metal-silicide layer.

The contact structures 233 electrically couple the source/drain regions 105a/105b/105c to overlying structures (not shown) such as conductive lines/vias and/or other active and passive devices. For example, an interconnect structure include alternating layers of dielectric material and conductive material may be formed over the contact structures 233 and the dielectric layer 131. The contact structures 233 can electrically couple the source/drain regions 105b to this interconnect structure.

Embodiments of the present disclosure can provide the ability to lower resistance of a contact formed over the source/drain regions of a FinFET. By pre-treating a contact opening with a pre-clean process and physical bombard of a material such as chlorine or fluorine, a subsequent silicide can be formed with a lower resistivity than formation of the silicide without the pre-clean and physical bombard. The silicide can be wider and deeper into the source/drain regions. The contact hole itself can also be wider at the bottom than previously available.

In some embodiments, a device includes a metal-silicide region formed in a semiconductor material. The metal-silicide region comprises a first material and a second material. The first material comprises a metal and the second material includes chlorine, fluorine, or a combination thereof. A first concentration of the second material is in the metal-silicide region near an uppermost portion of the metal-silicide region. A capping layer is over the metal-silicide region and over sidewalls of a contact plug opening. A contact plug is formed over the capping layer, filling the contact plug opening.

In some embodiments, a semiconductor device, includes a FinFET having a first gate structure and a second gate structure disposed thereon. Each of the first and second gate structures has a first gate spacer and a second gate spacer. Each of the first gate spacers are separated from each of the second gate spacers, for example, by a gate electrode. A source/drain region is located between the first and second gate structures. The semiconductor device includes a contact. The contact includes sidewalls comprising a first metal material which coincide with the first gate spacer of the first gate structure and the second gate spacer of the second gate structure and has a bottom that includes a metal silicide on an upper surface of the source/drain region. The contact includes a conductive material plug between the contact sidewalls and over the contact bottom. A cap layer lies between the plug and the silicide. One characteristic of the semiconductor device is that the metal silicide extends under the first gate spacer of the first gate structure and the second gate spacer of the second gate structure.

Some embodiments include a method. The method includes forming an opening between a first gate and a second gate and cleaning the opening. The bottom of the opening is bombarded with a first material, thereby causing a chemical reaction between the first material and a top surface of a contact area. A metal layer is deposited in the opening. A capping layer is deposited over the metal layer. A silicide is created at the top surface of the contact area, a metal plug is deposited in the opening.

One embodiment is a device including a metal-silicide region formed in a semiconductor material, the metal-silicide region including a first material and a second material, the first material including a metal, the second material including chlorine, fluorine, or ammonia, an uppermost portion of the metal-silicide region having a first concentration of the second material. The device also includes a contact plug formed over the capping layer, the contact plug including the second material at a first concentration, the second material having a decreasing concentration gradient extending into the metal-silicide region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a gate electrode, the gate electrode disposed over a semiconductor fin;
   a first set of gate spacers, the first set of gate spacers including a first spacer and a second spacer disposed on either side of the gate electrode, the first spacer being set apart from the gate electrode by a first distance, the second spacer being set apart from the gate electrode by a second distance, the first distance having a same value as the second distance, the first spacer and second spacer having a same height, a width of the first spacer being a narrower width along its entire length from top to bottom than the second spacer, the first spacer having a more vertical surface than a corresponding surface of the second spacer;

a metal-silicide region formed in a semiconductor material, the semiconductor material corresponding to a source/drain region, the source/drain region interfacing with the semiconductor fin, the metal-silicide region comprising a first material and a second material, the first material comprising a metal, the second material comprising fluorine, an uppermost portion of the metal-silicide region having a highest concentration of the second material at an interface of the metal silicide region, a gradient of concentration decreasing from the highest concentration to a non-zero second concentration at a first depth of the metal-silicide region, the first depth of the metal-silicide region disposed about midway between an upper extent of the metal-silicide region and a lower extent of the metal-silicide region, the second concentration remains about the same from the first depth to the lower extent of the metal-silicide region;

a capping layer over the metal-silicide region and extending along a sidewall of the first set of gate spacers; and a contact plug formed over the capping layer, wherein a top surface of the contact plug, a top surface of the capping layer, a top surface of the first spacer, and a top surface of the second spacer are all planar.

2. The device of claim 1, further comprising a metal layer between the metal-silicide region and the capping layer, the metal layer comprising the first material, the metal layer having a bottom surface aligned with a bottom surface of the first spacer and with a bottom surface of the second spacer.

3. The device of claim 2, wherein the metal-silicide region is wider than a bottom of the contact plug, extending laterally under the first set of gate spacers.

4. The device of claim 2, wherein the second material is in physical contact with the metal layer.

5. The device of claim 1, further comprising a second source/drain region disposed under the second spacer on an opposite side of the semiconductor fin than the metal-silicide region, the second source/drain region comprising the semiconductor material.

6. The device of claim 1, the device of claim 1, further comprising a third spacer and a fourth spacer, the third spacer interposed between the first spacer and the gate electrode, the fourth spacer interposed between the second spacer and the gate electrode, a bottom surface of the third spacer and a bottom surface of the fourth spacer being level with a bottom surface of the first spacer and a bottom surface of the second spacer.

7. A semiconductor device comprising:
a Fin Field Effect Transistor (FinFET) having a first gate structure and a second gate structure, each of the first and second gate structures comprising a first gate spacer and a second gate spacer, each of the first gate spacers being separated from each of the second gate spacers by a gate electrode, each of the first gate spacers being a same height as each of the respective second gate spacers;
a source/drain region between the first and second gate structures, the source/drain region comprising a semiconductor material, a metal silicide disposed at an upper area of the semiconductor material, and a first material embedded in the metal silicide, the first material comprising fluorine; and
a contact comprising:
sidewalls comprising a first metal material which coincide with the first gate spacer of the first gate structure and the second gate spacer of the second gate structure,
a plug disposed between the sidewalls, the plug comprising a conductive material, and
a cap layer disposed between the plug and the metal silicide of the source/drain region, the contact disposed on an uppermost surface of the source/drain region,
wherein the first material embedded in the metal silicide has a highest concentration at an interface of the metal silicide and the contact, wherein a gradient of concentration decreases from the highest concentration to a positive second concentration at a first depth of the metal silicide, the first depth of the metal silicide disposed about midway between an upper extent of the metal silicide and a lower extent of the metal silicide, wherein the positive second concentration remains about the same from the first depth of the metal silicide to an interface between the metal silicide and the source/drain region, wherein the contact has a top surface that is level with a top surface of the first gate spacer and with a top surface of the second gate spacer, and further wherein the first material has a concentration equal to the positive second concentration in an upper portion of the source/drain region.

8. The semiconductor device of claim 7, wherein the contact further comprises:
a metal layer disposed between the cap layer and the metal silicide, the metal layer comprising the first metal material, the metal layer having a bottom surface level with a bottom surface of the first spacer of the first gate structure and level with a bottom surface of the first spacer of the second gate spacer.

9. The semiconductor device of claim 8, wherein the first gate spacer of the first gate structure has a first outer surface facing away from the first gate structure, and the second gate spacer of the first gate structure has a second outer surface facing away from the first gate structure, the first outer surface being more vertical than the second outer surface.

10. The semiconductor device of claim 9, wherein the metal silicide extends under the first gate spacer of the first gate structure by a distance between 2.5 nm and 5 nm, and wherein the first gate spacer is separated from the gate electrode of the first gate structure by a third gate spacer, wherein the metal silicide is separated from the gate electrode by a distance corresponding to a width of the third gate spacer, and wherein the third gate spacer and the first gate spacer of the first gate structure have the same vertical extents.

11. The semiconductor device of claim 9, wherein the first depth is at a midway point of the metal silicide, the second concentration continuing from the first depth through a remaining thickness of the metal silicide.

12. A device comprising:
a gate stack comprising a first gate spacer and a second gate spacer formed on opposing sides of a gate electrode, wherein a sidewall of the first gate spacer has a first vertical slope and a sidewall of the second gate spacer has a second vertical slope, the first vertical slope being greater than the second vertical slope;

a first semiconductor region comprising a metal-silicide region disposed in a semiconductor material, the metal-silicide region being in physical contact with the bottom surface of the first gate spacer, the first semiconductor region disposed under the first gate spacer and between the first gate spacer and an adjacent gate spacer of an adjacent gate stack, the metal-silicide region comprising a first material and a second material, the second material comprising fluorine, the metal-silicide region having a third width profile at a top surface of the metal-silicide region;

a second semiconductor region comprising the semiconductor material and the second material, the second semiconductor region disposed under the second gate spacer;

a contact over the metal-silicide region, the contact comprising a metal fill, wherein a top surface of the contact is aligned with the top surface of the first gate spacer and with the top surface of the second gate spacer, and wherein a bottom surface of the contact is aligned with the bottom surface of the first gate spacer and with the bottom surface of the second gate spacer, the contact having a fourth width profile at the bottom surface of the contact; and wherein the second material embedded in the metal-silicide region has a highest concentration at an interface of the metal-silicide region and the contact, a gradient of concentration decreasing from the highest concentration to a non-zero second concentration at a first depth of the metal-silicide region, the first depth of the metal-silicide region disposed about midway between an upper extent of the metal-silicide region and a lower extent of the metal-silicide region, the second concentration remains about the same from the first depth to the lower extent of the metal-silicide region.

13. The device of claim 12, wherein the contact further comprises a capping layer surrounding the metal fill.

14. The device of claim 13, wherein the contact further comprises a metal layer, the metal layer interposed between the metal-silicide region and the capping layer, the metal layer comprising the metal of the first material, wherein a bottom surface of the metal layer is level with a bottom surface of the first gate spacer and with a bottom surface of the second gate spacer.

15. The device of claim 14, wherein the metal layer comprises fluorine.

16. The device of claim 15, wherein the gate stack further comprises a third gate spacer and a fourth gate spacer disposed on opposing sides of the gate electrode, the third gate spacer positionally mirrored across the gate electrode from the fourth gate spacer, the third gate spacer interposed between the first gate spacer and the gate electrode, the fourth gate spacer interposed between the second gate spacer and the gate electrode, wherein the metal-silicide region extends under the first gate spacer and not under the third gate spacer, the third gate spacer and fourth gate spacer having substantially the same width, and wherein an upper surface of the third gate spacer and a bottom surface of the third gate spacer are respectively level with an upper surface of the first gate spacer and the bottom surface of the first gate spacer.

17. The device of claim 16, wherein the first gate spacer of the gate stack has a first outer surface facing away from the gate stack, and the second gate spacer of the gate stack has a second outer surface facing away from the gate stack, the first outer surface being more vertical than the second outer surface.

18. The device of claim 16, wherein the metal-silicide region extends laterally under the first gate spacer by a distance between 2.5 nm and 5 nm, wherein the bottom of the third gate spacer is coplanar with an upper surface of the first semiconductor region, and wherein the metal-silicide region is separated from the gate electrode by a distance corresponding to a width of the third gate spacer.

19. The device of claim 13, wherein the capping layer comprises fluorine.

20. The device of claim 12, wherein a sidewall of the contact is in contact with the first gate spacer.

* * * * *